US010319568B2

(12) United States Patent
Shimizu et al.

(10) Patent No.: US 10,319,568 B2
(45) Date of Patent: Jun. 11, 2019

(54) PLASMA PROCESSING APPARATUS FOR PERFORMING PLASMA PROCESS FOR TARGET OBJECT

(71) Applicant: TOKYO ELECTRON LIMITED, Tokyo (JP)

(72) Inventors: Ippei Shimizu, Miyagi (JP); Naoki Mihara, Miyagi (JP); Shunsuke Ogata, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 533 days.

(21) Appl. No.: 14/524,054

(22) Filed: Oct. 27, 2014

(65) Prior Publication Data

US 2015/0129129 A1 May 14, 2015

(30) Foreign Application Priority Data

Nov. 12, 2013 (JP) ................................. 2013-233854
Dec. 27, 2013 (JP) ................................. 2013-273336

(51) Int. Cl.
*F16K 31/00* (2006.01)
*C23C 16/44* (2006.01)
(Continued)

(52) U.S. Cl.
CPC .... *H01J 37/32651* (2013.01); *C23C 16/4401* (2013.01); *H01J 37/32513* (2013.01);
(Continued)

(58) Field of Classification Search
CPC ........... H01J 37/32431; H01J 37/32651; H01J 37/32853; H01J 37/32513;
(Continued)

(56) References Cited

U.S. PATENT DOCUMENTS 5,376,213 A * 12/1994 Ueda ................... C23C 16/4586
156/345.27
2004/0149214 A1* 8/2004 Hirose .............. H01J 37/32458
118/715

(Continued)

FOREIGN PATENT DOCUMENTS

JP 2001-102435 A 4/2001
JP 2002-141403 A 5/2002

(Continued)

*Primary Examiner* — Rakesh K Dhingra
*Assistant Examiner* — Laureen Chan
(74) *Attorney, Agent, or Firm* — Rothwell, Figg, Ernst & Manbeck, P.C.

(57) ABSTRACT

A plasma processing apparatus includes a process chamber including a sidewall, a mounting table disposed in the process chamber, a shield member which is disposed along the inner surface of the sidewall to surround the mounting table and has an opening facing the transfer port, and a shutter configured to open/close the opening, the shutter being movable up and down. The shutter has a first portion adapted to face the opening, and a second portion adapted to face the shield member at a lower side of the shield member. The shield member has a lower portion including a contact surface facing the second portion. A contactor adapted to contact the contact surface is disposed at the second portion. The first portion of the shutter closes the opening through a gap between the first portion and the shield member. The contact surface and the contactor are formed of HASTEL-LOY®.

6 Claims, 22 Drawing Sheets

(51) Int. Cl.
*H01J 37/32* (2006.01)
*F16K 3/00* (2006.01)

(52) U.S. Cl.
CPC .. *H01J 37/32743* (2013.01); *H01J 37/32853* (2013.01); *F16K 3/00* (2013.01)

(58) Field of Classification Search
CPC ........... H01J 37/32743; H01J 37/32477; H01J 37/32495; H01J 37/32504; H01J 2237/0203; F16K 3/029; C23C 14/56–14/568; C23C 16/4401–16/4409; H01L 21/67126
See application file for complete search history.

(56) References Cited

U.S. PATENT DOCUMENTS

| | | | | |
|---|---|---|---|---|
| 2004/0221808 | A1* | 11/2004 | Kawano | C23C 16/4401 118/715 |
| 2005/0095732 | A1* | 5/2005 | Maebashi | H01J 37/32082 438/17 |
| 2006/0273277 | A1* | 12/2006 | Heller | H01J 37/32495 251/334 |
| 2006/0288934 | A1* | 12/2006 | Takahashi | C23F 4/00 118/715 |
| 2007/0000608 | A1* | 1/2007 | Lee | F16K 3/0227 156/345.3 |
| 2007/0012251 | A1* | 1/2007 | Zucker | C23C 16/4409 118/733 |
| 2007/0131167 | A1 | 6/2007 | Kodashima et al. | |
| 2007/0215283 | A1* | 9/2007 | Kobayashi | H01J 37/32477 156/345.43 |
| 2008/0268281 | A1* | 10/2008 | Bai | C23C 14/564 428/650 |
| 2009/0114153 | A1* | 5/2009 | Kurita | C23C 16/54 118/722 |
| 2010/0212592 | A1* | 8/2010 | Li | C23C 16/4409 118/723 R |
| 2016/0013025 | A1* | 1/2016 | Nagorny | H01J 37/32513 156/285 |

FOREIGN PATENT DOCUMENTS

| | | |
|---|---|---|
| JP | 2005-123578 A | 5/2005 |
| JP | 2007-165659 A | 6/2007 |
| JP | 2011-171763 A | 9/2011 |
| JP | 2012-28682 A | 2/2012 |
| JP | 2012-99765 A | 5/2012 |
| WO | 00/75972 A1 | 12/2000 |

* cited by examiner

PLASMA PROCESSING APPARATUS FOR PERFORMING PLASMA PROCESS FOR TARGET OBJECT

CROSS-REFERENCE TO RELATED APPLICATIONS

This application claims priority to Japanese Patent Applications Nos. 2013-233854 and 2013-273336 respectively filed on Nov. 12, 2013 and Dec. 27, 2013, the entire contents of which are incorporated herein by reference.

FIELD OF THE INVENTION

Embodiments of the present invention relate to a plasma processing apparatus.

BACKGROUND OF THE INVENTION

In manufacturing electronic devices such as semiconductor devices, a plasma processing apparatus is used to perform a plasma process for a target object. The plasma process includes various processes such as etching and deposition using plasma of process gases.

The plasma processing apparatus used for the plasma process includes a process chamber in which plasma processing spaces are defined. A transfer path for loading/unloading a target object is formed in a sidewall of the process chamber. In addition, a shield member (deposit shield) for protecting the inner surface of the sidewall of the process chamber is arranged along the inner surface of the sidewall. The shield member is formed with an opening for loading/unloading of a target object, which faces the transfer path. Further, a shutter which can be elevated to open/close the opening of the shield member is interposed between the inner surface of the sidewall and the shield member. The shutter and the shield member are typically made of aluminum. Typically, when the opening of the shield member is closed, the shutter makes contact with the shield member. Such a plasma processing apparatus is disclosed in Japanese Patent Application Publication No. 2007-165659.

In the above plasma processing apparatus, when the contact of the shutter with the shield member is repeated, the shield member and the shutter may be worn to produce aluminum particles. When the produced particles are exposed to plasma, the particles are degenerated into particles such as aluminum fluoride or aluminum oxide which may be attached to a target object.

In light of the above circumstances, there is a need for a plasma processing apparatus which is capable of preventing particles from being produced from a shutter and a shield member.

SUMMARY OF THE INVENTION

In accordance with an aspect of the present invention, there is provided a plasma processing apparatus for performing a plasma process for a target object, including: a process chamber including a sidewall having a transfer port for loading/unloading the target object; a mounting table disposed in the process chamber; a shield member disposed along an inner surface of the sidewall to surround the mounting table, the shield member including an opening which faces the transfer port; and a shutter configured to open/close the opening, the shutter being movable up and down. The shutter includes a first portion adapted to face the opening, and a second portion adapted to face the shield member at a lower side of the shield member. The shield member further includes a lower portion which has a contact surface adapted to face the second portion. A contactor adapted to contact the contact surface is disposed at the second portion. The first portion of the shutter closes the opening through a gap which is provided between the first portion and the shield member. The contact surface and the contactor are formed of HASTELLOY®.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENTS

Figure 1:
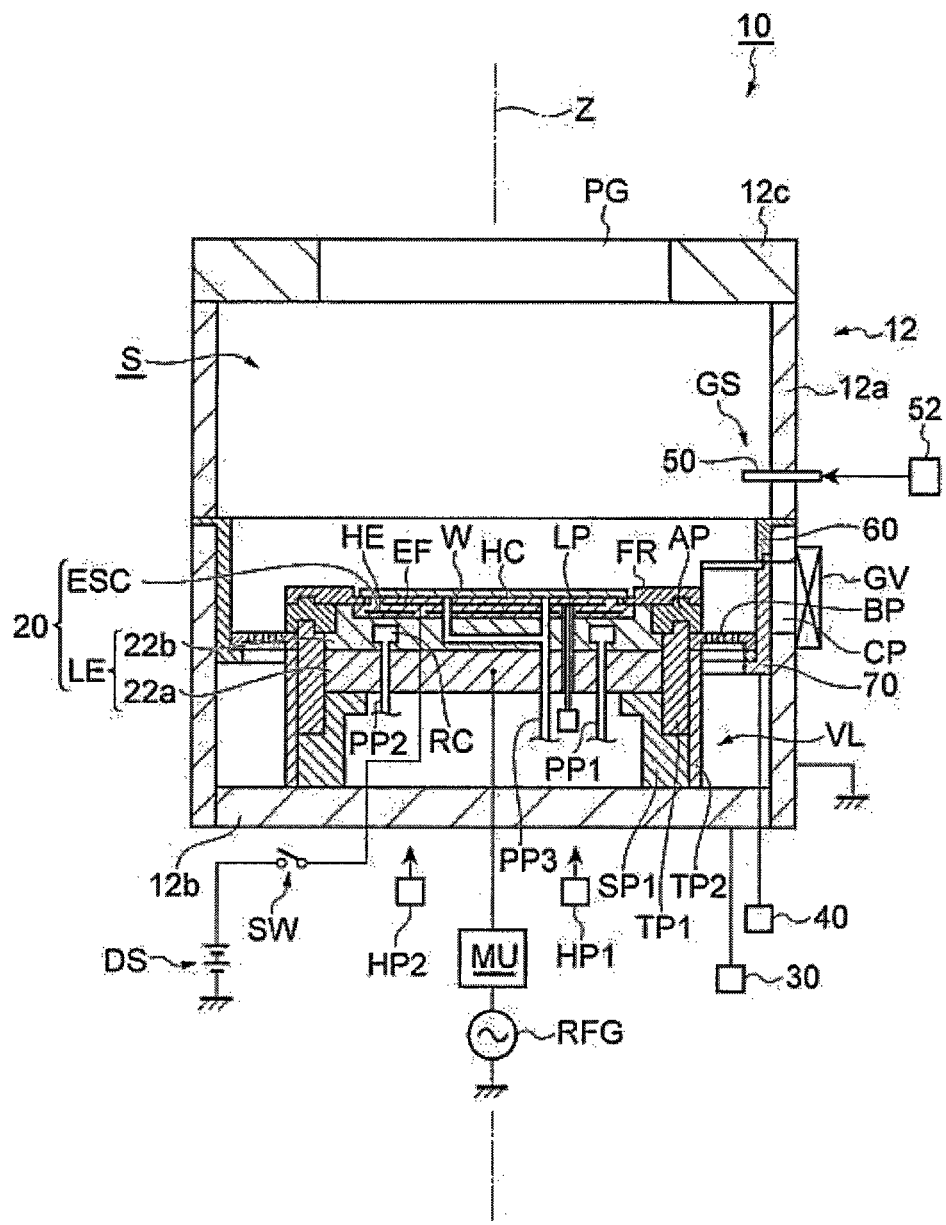
FIG. 1 is a view schematically showing a plasma processing apparatus according to one embodiment.

Hereinafter, various embodiments will be described in detail with reference to the accompanying drawings. Throughout the drawings, the same or similar elements are denoted by the same reference numerals.

First Embodiment

FIG. 1 is a view schematically showing a plasma processing apparatus 10 according to a first embodiment. FIG. 1 schematically shows a longitudinal section of the plasma processing apparatus 10. The plasma processing apparatus 10 shown in FIG. 1 is an apparatus for performing a plasma process on a target object (hereinafter referred to as "wafer W").

The plasma processing apparatus 10 includes a process chamber 12. The process chamber 12 defines an internal process space S. In the plasma processing apparatus 10, the wafer W is accommodated in the process space S and is subjected to a plasma process.

In this embodiment, the process chamber 12 has a sidewall 12a, a bottom wall 12b and a ceiling wall 12c. The sidewall 12a has a cylindrical shape and extends vertically along a central axis Z. Hereinafter, in the specification, a direction of extension of the axis Z is referred to as an "axis Z direction", "vertical direction" or "up and down". In addition a direction radial to the axis Z is referred to as a "radial direction". Further, a direction along an arc whose center is placed on the axis Z is referred to as a "circumferential direction".

The bottom wall 12b is provided at the lower end side of the sidewall 12a and the ceiling wall 12c is provided at the upper end side of the sidewall 12a. In addition, a transfer port CP for loading the wafer W into the process chamber 12 and unloading the wafer W from the process chamber 12 is formed in the sidewall 12a. The transfer port CP can be opened/closed by a gate valve GV.

The plasma processing apparatus 10 further includes a mounting table 20. The mounting table is disposed within the process chamber 12. A shield member 60 surrounding the mounting table 20 is provided along the inner surface of the sidewall 12a of the process chamber 12. The shield member 60 is a member for preventing reaction products produced by the plasma process from being deposited on the inner surface of the sidewall 12a. The shield member 60 has a cylindrical shape and has a central axis substantially coincident with the axis Z. The shield member 60 is formed with an opening OP (see FIGS. 2 and 3) facing the transfer port CP.

In addition, as shown in FIG. 1, a shutter 70 for opening/closing the opening OP of the shield member 60 is disposed in the process chamber 12. The shutter 70 can be moved up and down. The shutter 70 is connected to a driver 40. The driver 40 moves the shutter 70 vertically. Specifically, the shutter 70 is located in a first region when the opening OP is closed for the plasma process. On the other hand, the shutter 70 is located in a second region when the opening OP is opened to the transfer port CP for loading/unloading of the wafer W. The second region lies below the first region. The shield member 60 and the shutter 70 will be described in more detail later.

The mounting table 20 includes a lower electrode LE and an electrostatic chuck ESC. The lower electrode LE is connected to a radio frequency (RF) power generator RFG via a matching unit MU. The RF power generator RFG generates RF (bias) power for ion attraction. The electrostatic chuck ESC is disposed on the lower electrode LE. The electrostatic chuck ESC attracts and holds the wafer W mounted thereon by a Coulomb force.

As one example, the lower electrode LE includes a first plate 22a and a second plate 22b. The first plate 22a has a disc shape. The first plate 22a is made of conductive material such as aluminum. The first plate 22a is supported by a cylindrical support part SP1. The support part SP1 extends upward from the bottom wall 12b and is in contact with the peripheral region of the lower surface of the first plate 22a. The support part SP1 is made of an insulator such as quartz.

The second plate 22b is placed on the first plate 22a. The second plate 22b has a disc shape. The second plate 22b is made of conductive material such as aluminum. The second plate 22b makes electric conduction with the first plate 22a.

The first plate 22a is electrically connected with the RF power generator RFG via the matching unit MU. The RF power generator RFG outputs RF bias power having a frequency (e.g., 13.56 MHz) suitable to control energy of ions attracted to the wafer W. The matching unit MU includes a matching device for matching impedance of the side of the RF power generator RFG and impedance of the load side such as the electrodes, plasma and the process chamber 12. The matching device contains a blocking capacitor for self-bias generation.

The second plate 22b is therein provided with a coolant channel RC. A coolant (e.g., cooling water) having a predetermined temperature is circulatively supplied into the coolant channel RC from a chiller unit through pipes PP1 and PP2. The temperature of the wafer W on the electrostatic chuck ESC can be controlled by the circulated coolant. Further, a heat transfer gas (e.g., $H_2$ gas) from a heat transfer supply unit is supplied between the top surface of the electrostatic chuck ESC and the backside of the wafer W through a supply pipe PP3.

The electrostatic chuck ESC is disposed on the top surface of the second plate 22b. The electrostatic chuck ESC has a disc shape. The electrostatic chuck ESC holds the wafer W by an electrostatic attraction force. To this end, the electrostatic chuck ESC includes an electrode film EF interposed between dielectric films. The electrode film EF is electrically connected with a DC power supply DS via a switch SW. The electrostatic chuck ESC can attracts and hold the wafer W thereon by a Coulomb force generated by a DC voltage applied from the DC power supply DS.

In addition, a heater HC and a heater HE are provided within the dielectric films of the electrostatic chuck ESC. The heater HC is placed in the central region of the electrostatic chuck ESC. The heater HC is connected with a heater power supply HP1. The heater power supply HP1 supplies AC power to the heater HC. The heater HE is provided at the radial outside of the heater HC. The heater HE is connected with a heater power supply HP2. The heater power supply HP2 supplies AC power to the heater HE.

In addition, through-holes are formed in the electrostatic chuck ESC and the lower electrode LE in such a manner that it penetrates through them. Pusher pins LP pass through the respective through-holes. The pusher pins LP are ascended at the time of loading/unloading of the wafer W and support the wafer W.

In addition, a focus ring FR is provided at the radial outside of the electrostatic chuck ESC. The focus ring FR extends annularly along an edge of the electrostatic chuck ESC and an edge of the wafer W to surround the electrostatic chuck ESC. The focus ring FR is formed of dielectric such as quartz. The focus ring FR is provided to adjust a sheath potential at the outside of the edge of the wafer W and contributes to the in-plane uniformity of plasma process of the wafer W.

A tubular part TP1 is disposed below the focus ring FR. The tubular part TP1 is formed of an insulator such as alumina. The tubular part TP1 has a cylindrical shape and extends along the periphery of the lower electrode LE.

An annular part AP is interposed between the tubular part TP1 and the focus ring FR. The annular part AP is formed of an insulator such as alumina. The annular part AP extends annularly along the periphery of the second plate 22b. The top surface of the annular part AP is in contact with the lower surface of the focus ring FR. The bottom surface of the annular part AP is in contact with the top of the tubular part TP1.

A tubular part TP2 is disposed below the periphery of the annular part AP. The tubular part TP2 has a cylindrical shape. The tubular part TP2 extends along the peripheries of the tubular part TP1 and the support part SP1. The tubular part TP2 is made of conductive material such as aluminum. In addition, a film made of yttria ($Y_2O_3$) may be formed on the surface of the tubular part TP2. Alternatively, the surface of the tubular part TP2 may be subjected to an oxidation process.

A space between the peripheries of the tubular part TP2 and the annular part AP and the inner surfaces of the sidewall 12a and the shield member 60 serves as an exhaust path VL. The exhaust path VL extends to the bottom wall 12b and is connected to an exhaust unit 30 through an exhaust pipe provided at the bottom wall 12b. The exhaust unit 30 includes a pressure regulator and a vacuum pump such as a turbo molecular pump. The exhaust unit 30 is operable to exhaust a gas from the periphery of the mounting table 20 through the exhaust path VL and decompress the process space S in the process chamber 12 to a desired degree of vacuum.

A baffle plate BP is provided in the middle of the exhaust path VL in the vertical direction. The baffle plate BP is a plate-like member extending annularly about the axis Z. The baffle plate BP is formed with a plurality of through holes. The plurality of through holes penetrates through the baffle plate BP in the vertical direction. An inner edge of the baffle plate BP is interposed between the tubular part TP2 and the annular part AP. An outer edge of the baffle plate BP is supported by the shield member 60.

The plasma processing apparatus 10 further includes a plasma generation unit PG and a gas supply unit GS. The plasma generation unit PG introduces energy, which excites a gas supplied from the gas supply unit GS, into the process chamber 12. In one embodiment, the plasma generation unit PG is provided at the ceiling wall 12c. In one example, the plasma generation unit PG introduces a microwave into the process chamber 12. The plasma generation unit PG may be a capacitively-coupled plasma source. In this case, the plasma generation unit PG may be an upper electrode. When the plasma generation unit PG is the upper electrode, a RF power supply for generating RF power for plasma genera-tion may be connected to one of the upper electrode and the lower electrode LE. Alternatively, the plasma generation unit PG may be an inductively-coupled plasma source. As another alternative, the plasma generation unit PG may be a microwave supply unit.

The gas supply unit GS supplies a gas into the process chamber 12. The supplied gas is excited by energy provided by the plasma generation unit PG and a plasma process is performed by the excited gas. In one example, as shown in FIG. 1, the gas supply unit GS includes a gas introduction pipe 50. The gas introduction pipe 50 extends to the inside of the process chamber 12 from the outside. The gas introduction pipe 50 is connected to a gas source 52. The gas source 52 supplies a gas at a controlled flow rate for the plasma process performed for the wafer W. The gas supply unit GS is not limited to that shown in FIG. 1. For example, the gas supply unit GS may be one which supplies a gas from the ceiling wall 12c, instead of or in addition to the gas introduction pipe 50. If the plasma generation unit PG is the upper electrode, the gas supply unit GS may be a shower head constituted by the upper electrode.

Figure 2:
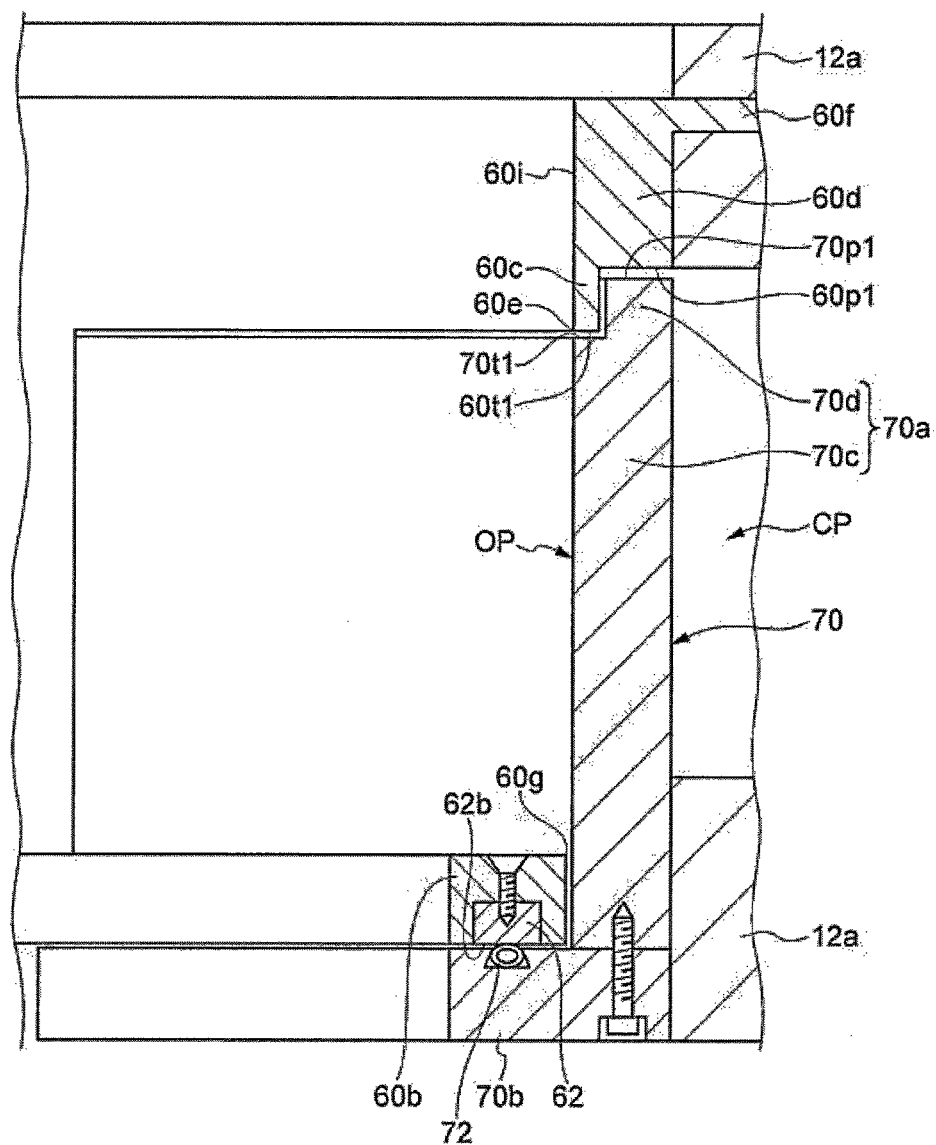
FIG. 2 is a sectional view showing a shield member and a shutter according to one embodiment.
Figure 3:
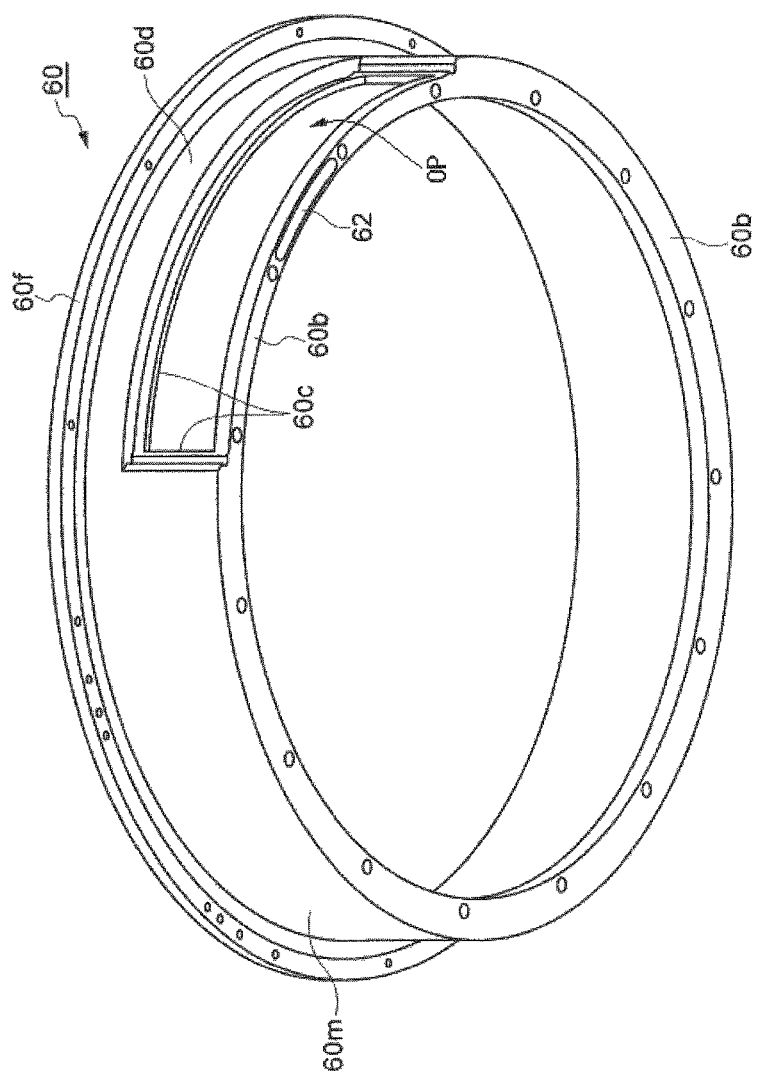
FIG. 3 is a perspective view of the shield member.
Figure 4:
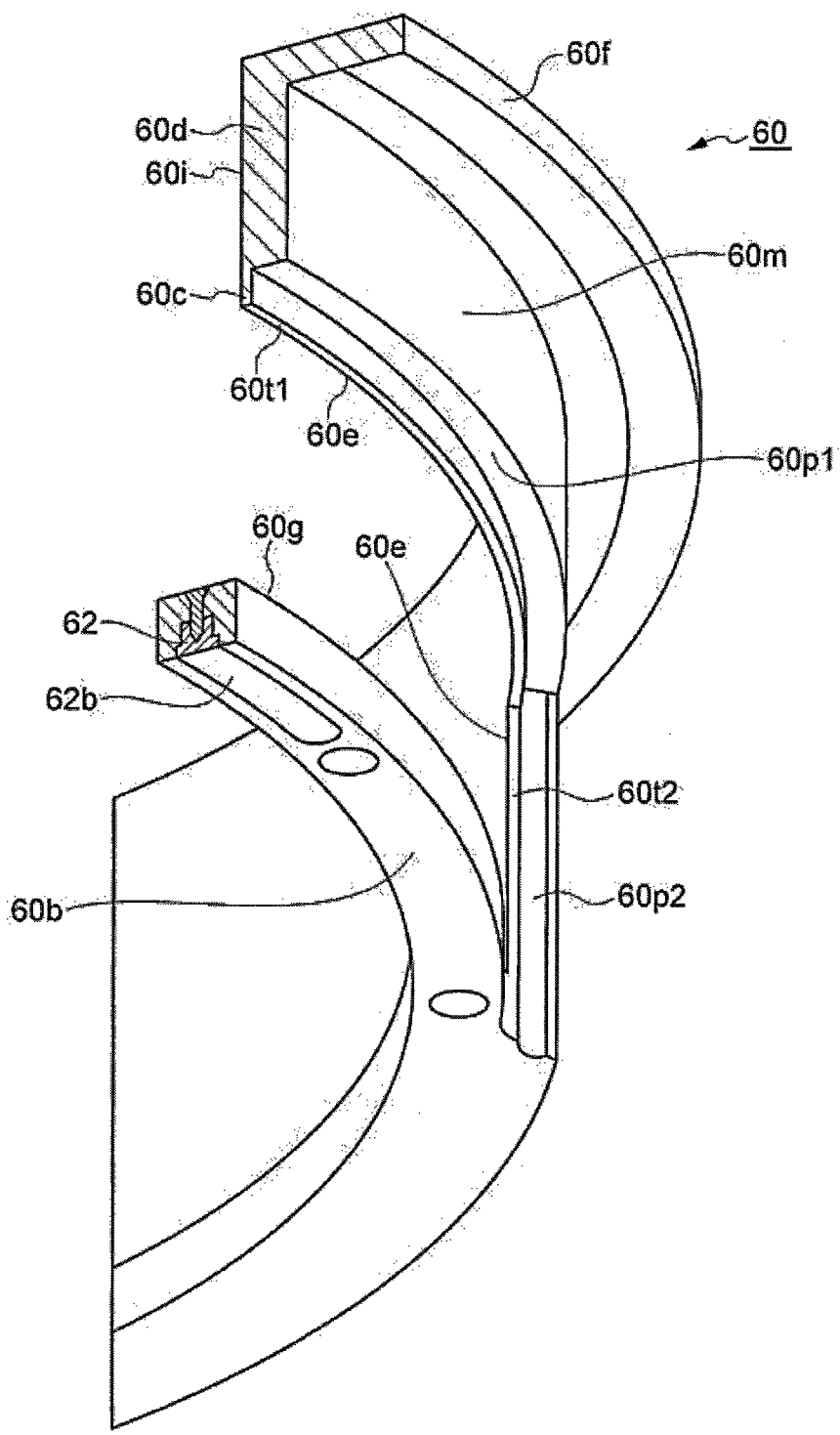
FIG. 4 is a cut-away perspective view showing a partially-enlarged portion of the shield member shown in FIG. 3.
Figure 5:
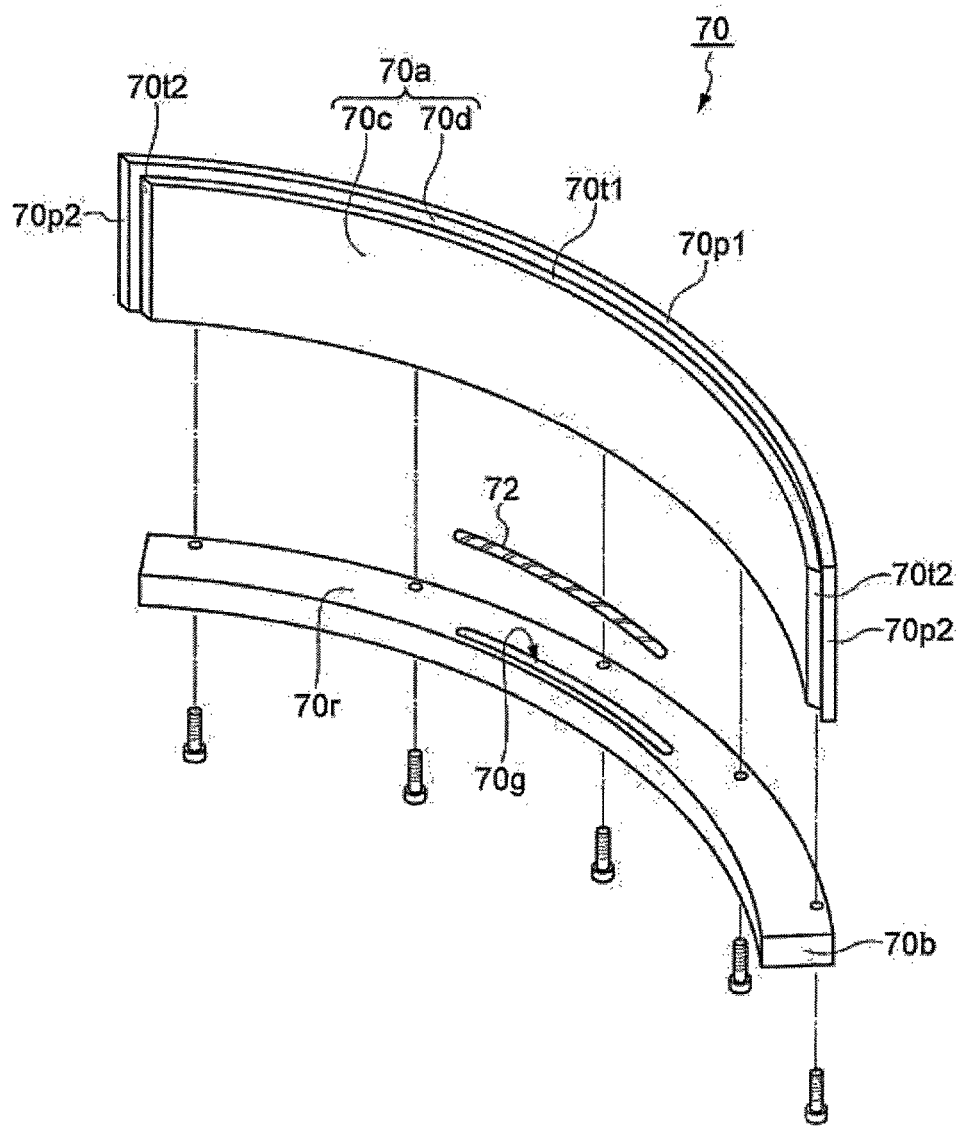
FIG. 5 is an exploded perspective view of the shutter.
Figure 6:
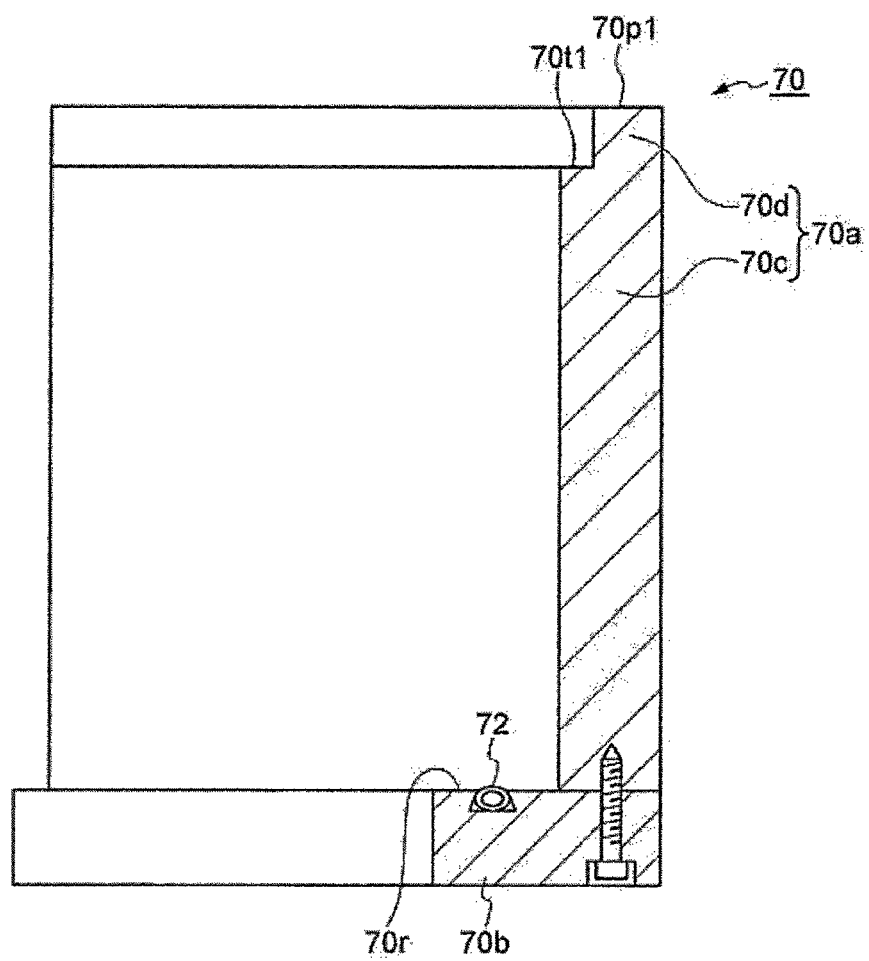
FIG. 6 is a sectional view of the shutter.

Hereinafter, the shield member 60 and the shutter 70 will be described in more detail. FIG. 2 is a sectional view showing the shield member and the shutter according to one embodiment, showing a state where the shutter is located in a first region and closes the opening of the shield member. FIG. 3 is a perspective view of the shield member according to the embodiment. FIG. 4 is a cut-away perspective view showing a partially-enlarged portion of the shield member shown in FIG. 3. FIG. 5 is an exploded perspective view of the shutter according to the embodiment. FIG. 6 is a sectional view of the shutter shown in FIG. 5.

As shown in FIG. 3, the shield member 60 has a main body 60m. The main body 60m has a cylindrical shape and is provided along the sidewall 12a in such a manner that its central axis is substantially coincident with the axis Z, as shown in FIG. 1. The main body 60m is made of, for example, aluminum. The surface of the main body 60m may be coated with a yttria ($Y_2O_3$) film or may be subjected to an oxidation process.

In the embodiment, as shown in FIGS. 2, 3 and 4, the main body 60m includes a flange 60f. The flange 60f forms the uppermost portion of the main body 60m. The flange 60f enlarges the outer diameter of the main body 60m in the uppermost port ion of the main body 60m. As shown in FIG. 2, the flange 60f is held by the sidewall 12a. Specifically, the sidewall 12a includes two parts which can be vertically separated from each other and the flange 60f is sandwiched between these two parts.

In addition, as shown in FIGS. 2, 3 and 4, the main body 60m has a bottom portion 60b. The bottom portion 60b forms the lowermost portion of the main body. The bottom portion 60b has a predetermined thickness in the height direction, i.e., a direction in which the axis Z extends (hereinafter referred to as an "axis Z direction"), and reduces the inner and outer diameters of the main body 60m in the lowermost portion of the main body 60m.

The main body 60m is formed with the opening OP. As shown in FIG. 2, the opening OP is provided to face the transfer port CP. As shown in FIGS. 2, 3 and 4, the main body 60m includes a thin portion 60c which defines the tip end and the circumferentially opposite ends of the opening OP. In addition, the main body 60m includes a thick portion 60d forming the main body 60m at the upper side and the circumferential opposite sides of the thin portion 60c. The thickness of the thin portion 60c in the radial direction is smaller than the thickness of the thick portion 60d in the radial direction. The inner periphery of the thin portion 60c and the inner periphery of the thick portion 60d are continuous and form the inner periphery 60. Accordingly, the outer periphery of the thin portion 60c is closer to the axis Z than the outer periphery of the thick portion 60d.

The thin portion 60c has an end surface 60t1 and a pair of end surfaces 60t2. The end surface 60t1 extends in the circumferential direction above the opening OP and faces downward. The pair of end surfaces 60t2 extends in the vertical direction from both edges of the end surface 60t1 in the circumferential direction and intersects the circumferential direction. An edge 60e as a boundary between these end surfaces 60t1 and 60t2 and the inner periphery 60i of the main body 60m extends in the circumferential direction to define the opening OP from above and extends in the vertical direction to define the opening OP from both sides of the circumferential direction. In addition, the bottom of the opening OP is defined by an edge 60g of the bottom portion 60b. The edge 60g forms an upper edge of the outer periphery of the bottom portion 60b.

As shown in FIG. 4, the thick portion 60d has an end surface 60p1 and a pair of end surfaces 60p2. The end surface 60p1 extends in the circumferential direction and faces downward. The end surface 60p1 extends upward and radially outward of the end surface 60t1. The pair of end surfaces 60p2 extends in the vertical direction from both edges of the end surface 60p1 in the circumferential direction and intersects the circumferential direction. The pair of end surfaces 60p1 is more distant from the opening OP in the circumferential direction than the pair of end surfaces 60t1 and extends radially outward of the pair of end surfaces 60t1.

The outer periphery of the bottom portion 60b is slightly closer to the axis Z than the inner periphery (i.e., the inn er periphery 60i) of the thin portion 60c. That is, a distance from the axis Z to the outer periphery of the bottom portion 60b is smaller than a distance from the axis Z to the inner periphery 60i. The outer periphery of the bottom portion 60b, the end surfaces 60t1 and 60t2 of the thin portion 60c and the end surfaces 60p1 and 60p2 of the thick portion 60d define a space in which a first portion 70a of the shutter 70 is accommodated as the shutter 70 is vertically moved.

In addition, as shown in FIGS. 2 and 4, a groove extending in the circumferential direction is formed in the lower surface of the bottom portion 60b. A bulk member 62 made of HASTELLOY® is fitted in the groove. The lower surface of the bulk member 62 forms a contact surface 62b. In addition, the bulk member 62 can be attached to the bottom portion 60b by screws. That is, the bulk member 62 can be detached from the bottom portion 60b.

As shown in FIGS. 5 and 6, the shutter 70 has the first portion 70a and a second portion 70b. The first portion 70a corresponds to a portion facing the opening OP when the shutter 70 closes the opening OP. The first portion 70a is made of, for example, aluminum. A film made of yttria ($Y_2O_3$) may be formed on the surface of the first portion 70a. Alternatively, the surface of the first portion 70a may be subjected to an oxidation process.

The first portion 70a has a plate shape extending in the circumferential direction. In the embodiment, the first portion 70a includes a thick portion 70c and a thin portion 70d. The thick portion 70c has an inner surface and an outer surface more distant from the axis Z than the inner surface. The radius of curvature of the inner surface of the thick portion 70c is approximately equal to a distance from the axis Z to the opening OP. The thick portion 70c also includes an end surface 70t1 and a pair of end surfaces 70t2. The end surface 70t1 corresponding to the top surface of the thick portion 70c extends in the circumferential direction and faces upward. The pair of end surfaces 70t2 extends in the vertical direction from both edges of the end surface 70t1 in the circumferential direction and intersects the circumferential direction.

The thin portion 70d is provided to project upward and circumferentially from a radial outer region of the thick portion 70c. The thin portion 70d includes an end surface 70p1 and a pair of end surfaces 70p2. The end surface 70p1 corresponding to the top surface of the thin portion 70d extends in the circumferential direction and faces upward. The end surface 70p1 extends upward and radially outward of the end surface 70t1. In addition, the pair of end surfaces 70p2 extends in the vertical direction from both edges of the end surface 70p1 in the circumferential direction and intersects the circumferential direction. The pair of end surfaces 70p2 is provided radially outward of the pair of end surfaces 70t2 and is more distant from the center of the first portion 70a in the circumferential direction than the pair of end surfaces 70t2.

The second portion 70b is attached to the lower end of the first portion 70a. In the embodiment, the second portion 70b is made of aluminum. A film made of yttria ($Y_2O_3$) may be formed on the surface of the second portion 70b. Alternatively, the surface of the second portion 70b may be subjected to an oxidation process. The second portion 70b has a plate shape extending in the circumferential direction. The radial length of the second portion 70b is larger than the radial length of the first portion 70a. The first portion 70a is provided such that the lower end of the first portion 70a is located on a radially outer region of the second portion 70b. That is, the first portion 70a is placed on the second portion 70b such that a radially inner region 70r of the top surface of the second portion 70b is exposed. The first portion 70a and the second portion 70b are attached to each other by screws. In other words, the first portion 70a and the second portion 70b are structured to be separated from each other.

A groove 70g is formed in the top surface of the region 70r of the second portion 70b. The groove 70g extends in the circumferential direction. A contactor 72 made of HASTELLOY® is fitted in the groove 70g. In the embodiment, the contactor 72 is an elastic member. The contactor has a spiral shape having an arc extending in the circumferential direction at its center axis.

Figure 7:
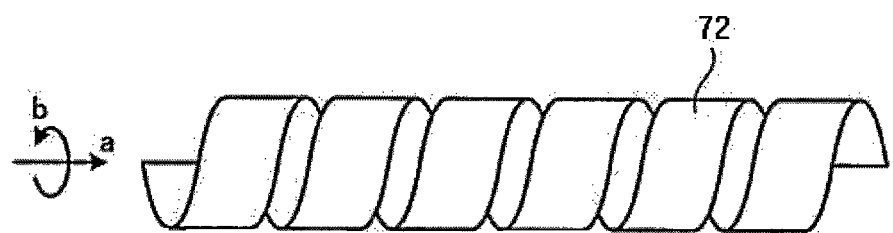
FIG. 7 is a view showing one configuration example of a contactor.

FIG. 7 is a view showing one configuration example of the contactor 72. In this embodiment, the contactor 72 is formed by spirally winding a band-like member made of HASTELLOY®, as shown in FIG. 7.

When the opening OP is closed by the shutter 70, the shutter 70 is moved upward from the second region to the first region. When the shutter 70 is disposed in the first region, the first portion 70a of the shutter 70 faces the opening OP, as shown in FIG. 2. Specifically, the inner surface of the thick portion 70c of the first portion 70a follows the opening OP.

In this state, the end surface 70t1 of the first portion 70a faces the end surface 60t1 of the shield member 60 through a gap. In addition, the pair of end surfaces 70t2 of the first portion 70a faces the pair of end surfaces 60t2 of the shield member 60 through a gap, respectively. In addition, the end surface 70p1 of the first portion 70a faces the end surface 60p1 of the shield member 60 through a gap. In addition, the pair of end surfaces 70p2 of the first portion 70a faces the pair of end surfaces 60p2 of the shield member 60 through a gap, respectively. Further, a surface connecting between the end surface 70t1 and the end surface 70p1 of the shutter 70 and between the pair of end surfaces 70p1 and the pair of end surface 70p2 faces a surface connecting between the end surface 60t1 and the end surface 60p1 of the shield member 60 and between the pair of end surface 60t2 and the pair of end surface 60p2 through a gap in the radial direction. Thus, a gap having a labyrinth structure is formed at the top side and the circumferentially opposite sides of the opening OP.

When the shutter 70 is disposed in the first region, the second portion 70b of the shutter 70 faces the bottom portion 60b of the shield member 60 from below. In addition, only the contactor 72 contacts the contact surface 62b. Thus, the shutter 70 and the shield member 60 contact with each other only through the contactor 72 and the contact surface 62b, so that particles can be prevented from being produced from the shut ter 70 and the shield member 60.

In addition, with the shutter 70, when the contactor 72 is exhausted, only the contactor 72 can be exchanged. Accordingly, the shutter 70 can be provided at a lower cost than a shutter 70 formed of HASTELLOY® in entirety.

Second Embodiment

Figure 8:
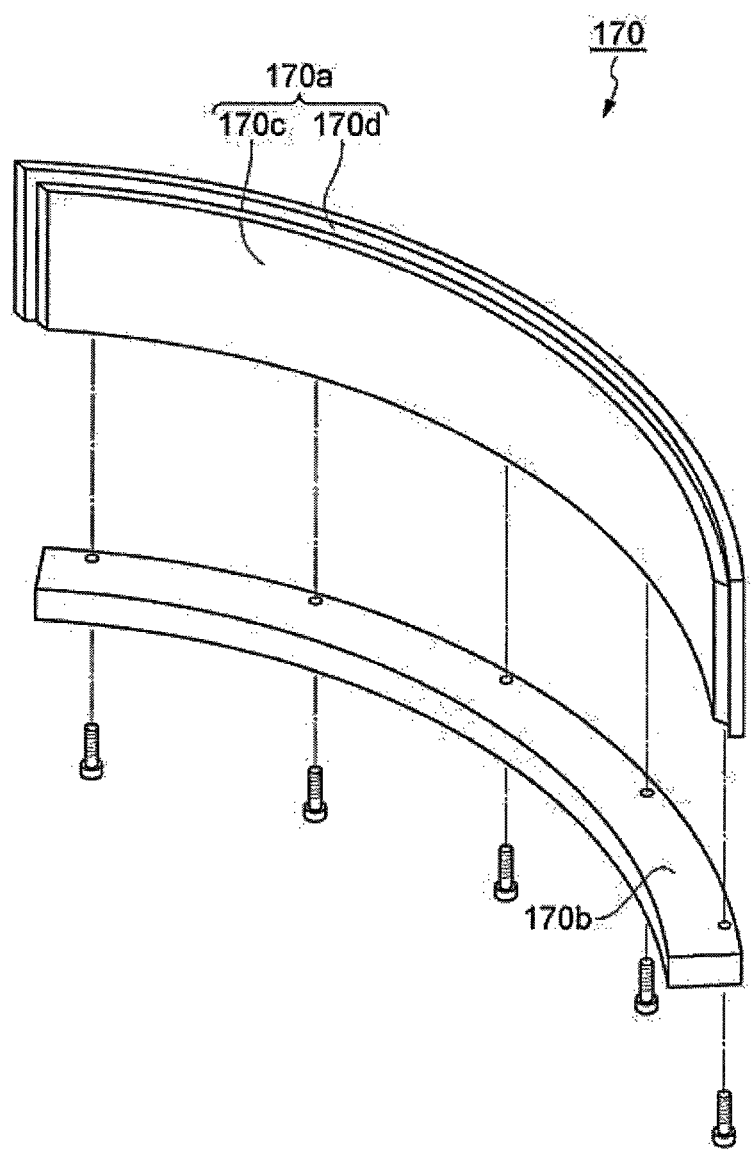
FIG. 8 is an exploded perspective view of a shutter according to another embodiment.

Hereinafter, a second embodiment will be described. FIG. 8 is an exploded perspective view showing a shutter according to a second embodiment. A shutter 170 shown in FIG. 8 has a first portion 70a, like the shutter 70. The shutter 170 also has a second portion 170b formed of HASTELLOY® in entirety, unlike the second portion 70b of the shutter 70. In addition, the groove 70g is not formed in the second portion 170b of the shutter 170. In this shutter 170, the second portion 170b serves as a contactor made of HASTELLOY®. With the shutter 170, when the contactor is exhausted, only the second portion 170b can be exchanged. Accordingly, the shutter can be provided at a low cost.

Although the first and second embodiments have been illustrated above, various modifications may be made without being limited to the disclosed embodiments. For example, the shutter may be formed of HASTELLOY® in entirety. In this case, the first portion and the second portion of the shutter may not be separated from each other or may be integrated. The shield member may be formed of HASTELLOY® in entirety. In this case, the lower part of the shield member provides the contact surface. Accordingly, the shield member need not to include a bulk member and no groove may be formed to mount the bulk member.

Although it has been illustrated in the above embodiments that only the contactor 72 contacts the contact surface 62b, the shutter 70 and the shield member 60 may make contact with each other at a portion other than the contactor 72 and the contact surface 62b. For example, the end surface 70p1 of the first portion 70a may contact the end surface 60p1 of the shield member 60. In this case, even if particles are produced by contact of the end surface 70p1 of the first portion 70a with the end surface 60p1 of the shield member 60, the thin portion 60c prevents the particles from being introduced into the process space S. In addition, a HASTELLOY® layer or a HASTELLOY® elastic member may be provided in one of the end surface 70p1 of the first portion 70a and the end surface 60p1 of the shield member 60.

Third Embodiment

Figure 9:
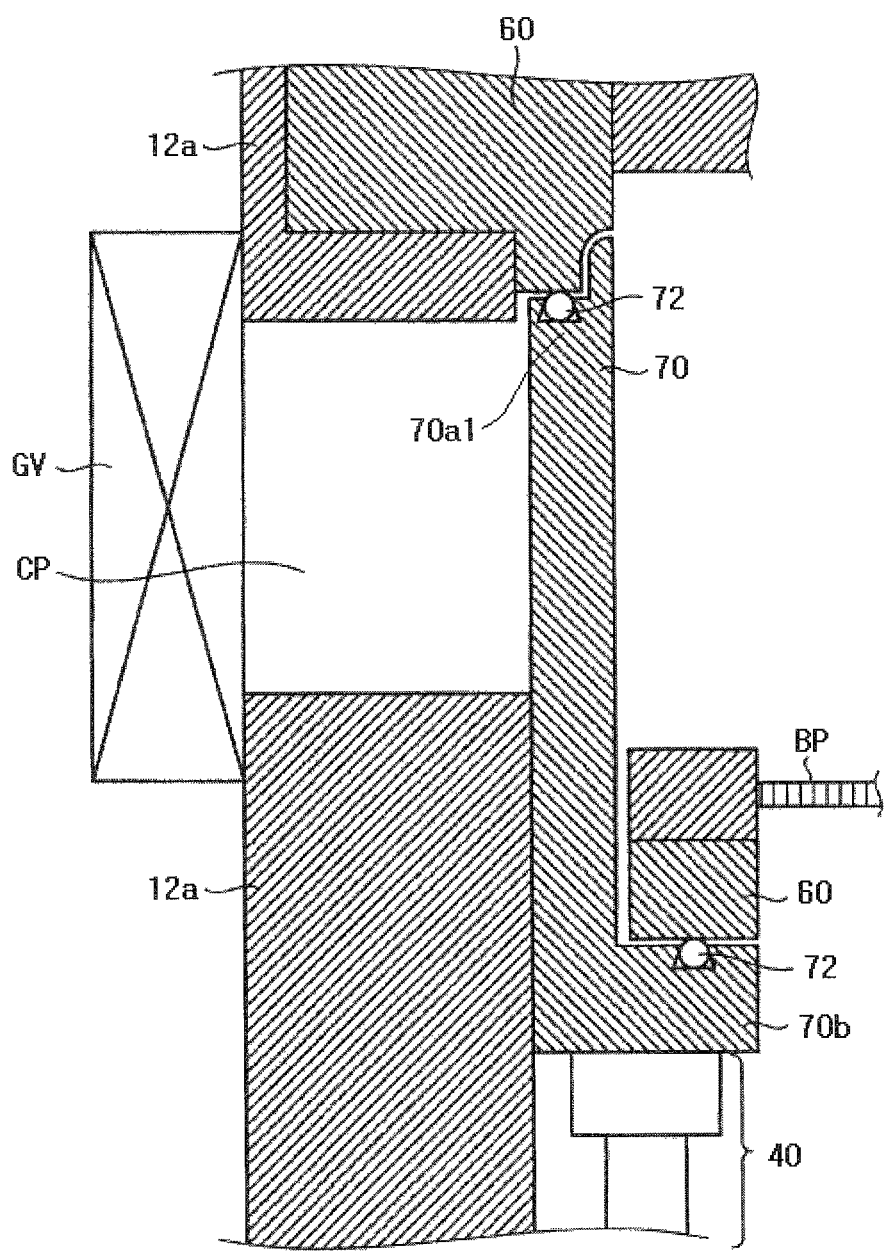
FIG. 9 is an enlarged sectional view showing an example configuration of the shutter and its vicinity.

Next, a configuration of a shutter 70 according to a third embodiment and its vicinity will be described. FIG. 9 is an enlarged view showing an example configuration of the shutter. The shutter 70 is an elongated plate-like member for opening/closing an opening 71a of a shield member 60. The shutter 70 is made of, for example, aluminum, and has an L-like section. The surface of the shutter 55 is coated with, for example, yttria ($Y_2O_3$) or the like.

In addition, as shown in the sectional view of FIG. 9, a spiral contactor 72 as a conductive elastic member is fitted in the top of the shutter 70. In addition, as shown in FIG. 9, in the lower part of the shutter 70 having an L-like section, a conductive contactor 72 is fitted in a groove formed in the top surface of the second portion 70b extending into the process space S (in the right side of FIG. 9).

The contactor 72 is disposed to extend in the circumferential direction of the top surface of the shutter 70 such that a central axis "a" with respect to a spiral winding direction "b" shown in FIG. 7 follows the top surface of the shutter 70. In addition, the contactor 72 is disposed to extend in the circumferential direction of the shutter 70 such that the central axis "a" follows the top surface of the lower second portion 70b of the shutter 70.

In this embodiment, for example, one contactor 72 is disposed along the top surface of the shutter 70. In addition, for example, a plurality of contactors 72 having a predetermined length is disposed on the top surface of the second portion 70b of the shutter 70 to extend in the circumferential direction of the shutter 70 at intervals. In addition, a plurality of contactors 72 having a predetermined length may be disposed on the top surface of the shutter 70 along the top surface of the shutter 70 at intervals or one contactor 72 may be disposed to extend in the circumferential direction of the shutter 70.

The shutter 70 closes and shields the opening OP of the shield member 60 by being moved upward by the driver 40 shown in FIG. 9 and opens the opening OP of the shield member 60 by being moved downward by the driver 40. In the state where the shutter 70 closes the opening OP of the shield member 60, the shutter 70 is electrically connected to the shield member 60 via the contactors 72 disposed in the upper portion 70a1 and the lower portion of the shutter when the contactors contact the shield member 60. Since the shield member 60 is in contact with the sidewall 12a of the process chamber 12, the shutter 70 is grounded through the shield member 60 in the state where the opening OP of the shield member 60 is closed.

Figure 10:
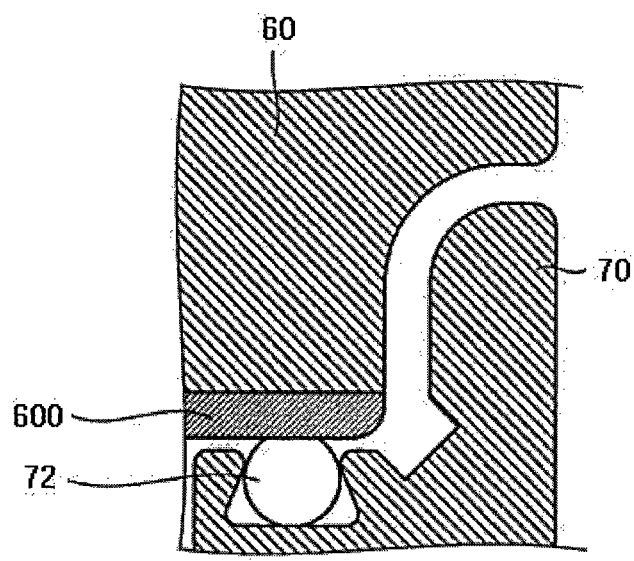
FIG. 10 is an enlarged view showing an example configuration of the upper portion of the shutter and its vicinity.

FIG. 10 is an enlarged view showing an example configuration of the upper portion of the top of the shutter and its vicinity. In this embodiment, as illustrated in FIG. 10, a layer 600 formed of HASTELLOY® is disposed on a surface of the shield member 60 in contact with the contactor 72 of the shutter 70. The HASTELLOY® layer 600 is formed at several hundred μm by spraying HASTELLOY® onto a pure aluminum surface of the shield member 60. In the state where the shutter 70 closes the opening OP of the shield member 60, the contactor 72 provided in the top surface of the shutter 70 makes contact with the HASTELLOY® layer 600 formed in the shield member 60. In addition, the groove provided in the top surface of the shutter, the contactor 72 fitted in the groove and the layer 600 formed on the surface of the shield member 60 may be collectively referred to as a "contact mechanism".

Figure 11:
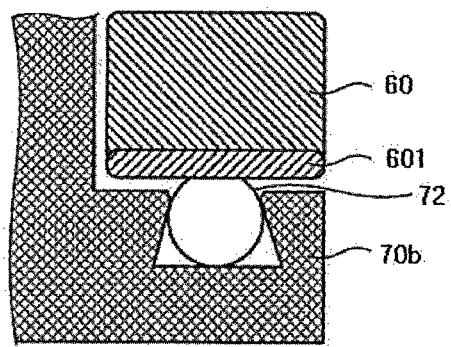
FIG. 11 is an enlarged view showing an example configuration of the lower portion of the shutter and its vicinity.

FIG. 11 is an enlarged view showing an example configuration of the lower portion of the shutter and its vicinity. In this embodiment, as illustrated in FIG. 11, a layer 601 formed of HASTELLOY® is disposed on the bottom surface of the shield member 60 in contact with the contactor 72 of the shutter 70. The HASTELLOY® layer 601 is formed at several hundred μm by spraying HASTELLOY® onto a pure aluminum surface of the shield member 60. In the state where the shutter 70 closes the opening OP of the shield member 60, the contactor 72 provided in the lower portion of the shutter 70 makes contact with the HASTELLOY® layer 601 formed on the shield member 60. In addition, the groove provided in the top surface of the second portion 70b of the shutter 70, the contactor 72 fitted in the groove and the layer 601 formed on the bottom surface of the shield member 60 may be collectively referred to as a "contact mechanism".

In this embodiment, since the contactors 72 disposed in the shutter 70 are formed of HASTELLOY®, the shutter 70 and the shield member 60 make electrical connection with each other via the contactors 72 formed of HASTELLOY® and the layers 600 and 601 formed of HASTELLOY®, as shown in FIGS. 10 and 11, under the state where the shutter 70 closes the opening OP of the shield member 60. In addition, in each of the layers 600 and 601 formed of HASTELLOY®, a concave portion conforming to the external shape of the contactor 72 may be provided in a surface contacting the contactor 72. Thus, each of the HASTELLOY® layers 600 and 601 can contact the contactor 72 over a wider area to provide less contact resistance under the state where the shutter 70 closes the opening OP of the shield member 60.

Hereinafter, results of experiments in which a plasma process is performed in the process chamber 12 in an embodiment where the surfaces of the shield member 60 in contact with the contactors 72 of the shutter 70 are formed of the HASTELLOY® layers 600 and 601 and a comparative example where the surfaces of the shield member 60 are formed of pure aluminum surface will be described. In the experiments, the plasma process was repeated in the embodiment and the comparative example and a state of the surface of the shield member 60 in contact with the upper contactor 72 of the shutter 70 was examined after the lapse of integration time (RF TIME) of about 100 and 400 hours.

Figure 12:
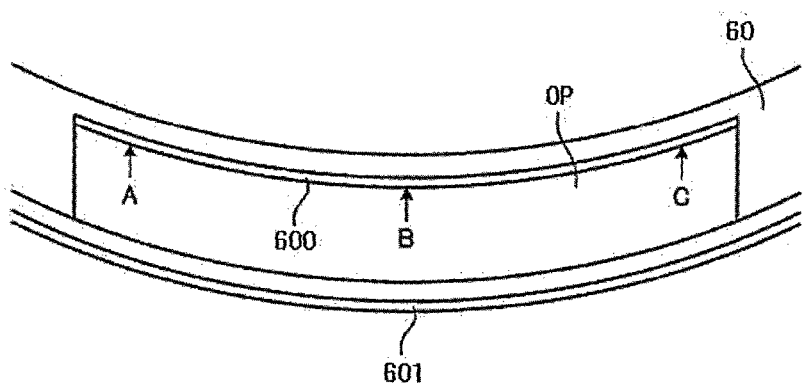
FIG. 12 is an explanatory view showing a position of the top end of an opening of a shield member.

FIG. 12 is an explanatory view showing a position of the top end of the opening of the shield member. In the experiments, as shown in FIG. 12, states of positions A, B and C in the surface of the shield member 60 (the top end surface of the opening OP) in contact with the contactor 72 on the top surface of the shutter 70 were examined.

Figure 13:
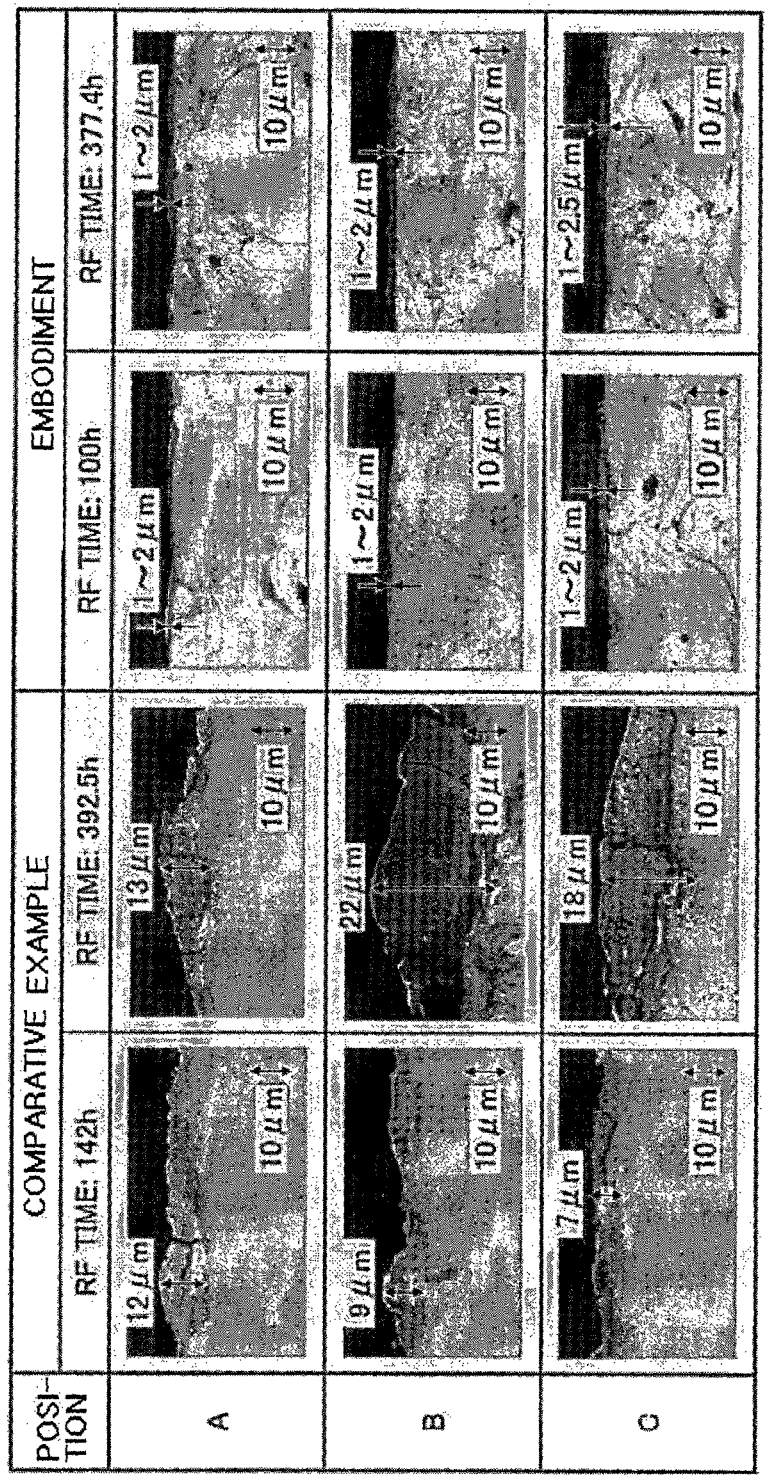
FIG. 13 is a view showing one example of results of experiments in a comparative example and the embodiment.

In the comparative example, as apparent from results of experiments shown in FIG. 13, for the pure aluminum surface of the shield member 60 at positions A, B and C, a thickness of the surface changed by corrosion reaches 7 μm to 12 μm at the point of plasma process integration time of 142 hours. At the point of plasma process integration time of 392.5 hours, the corrosion of the pure aluminum surface is further progressed to increase the thickness of the surface changed by corrosion to 13 μm to 22 μm.

Here, the main component of HASTELLOY® is nickel and aluminum is metal having higher ionization tendency than nickel.

Accordingly, when the HASTELLOY® contactor 72 is in contact with the pure aluminum surface of the shield member 60 under the state where the shutter 70 closes the opening OP of the shield member 60, the pure aluminum surface having higher ionization tendency is selectively corroded. In addition, since the external shape of the contactor 72 is curved, when the contactor 72 contacts the surface of the shield member 60, an electric field is likely to concentrate on the vicinity of the contact surface. Accordingly, it is believed that reaction of fluorine of the process gas with the pure aluminum surface of the shield member 60 is promoted in the course of the plasma process to accelerate the corrosion (fluoridation) of the pure aluminum surface of the shield member 60.

In the comparative example, it was analyzed that much insulating AlOF and AlFx were contained in the corroded portion generated in the pure aluminum surface. Since corrosive (fluoride) is formed in the contact surface of the shield member 60 in contact with the contactor 72 of the shutter 70, electric conduction of the shield member 60 and the contactor 72 of the shutter 70 is impeded, which prevents the potential of the shutter 70 from dropping to the ground potential. Accordingly, the process gas is supplied to the contact surface to lower an etching rate. This results in decrease of reaction products ejected from the semiconductor wafer W by etching and decrease of intensity of light emitted by the reaction products in the process chamber 12. Therefore, in an end point detector for measuring intensity of light having a unique wavelength emitted by the reaction products in plasma, abnormal decrease of the emission intensity may be detected as an EPD error.

FIG. 13 is a view showing one example of results of experiments in the comparative example and the present embodiment. As apparent from the results of experiments shown FIG. 13, in the embodiment, for the HASTELLOY® surface of the shield member 60 at positions A, B and C, a thickness of the surface changed by corrosion was about to 1 μm to 2 μm at the point of plasma process integration time of 100 hours. At the point of plasma process integration time of 377.4 hours, the corrosion of the HASTELLOY® surface was little progressed with the thickness of the surface changed by corrosion to about 1 μm to 2.5 μm.

Accordingly, in this embodiment, the electric conduction of the contactor 72 of the shutter 70 and the shield member 60 is maintained to prevent deterioration of uniformity of plasma generated in the process chamber 12 and reduction of an etching rate. Accordingly, the amount of reaction products ejected from the semiconductor wafer W by etching is maintained constant and the intensity of light emitted by the reaction products in the process chamber 12 is also maintained constant. Accordingly, while a film is being etched, the intensity of light of the reaction products ejected by the etching is stable to prevent occurrence of an EPD error.

Figure 14A:
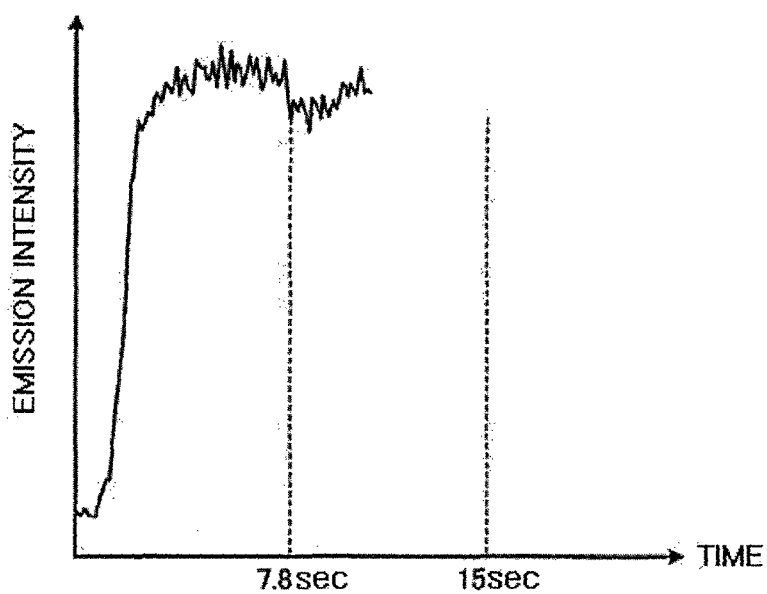
FIG. 14A is a view showing one example of temporal change of the emission intensity of reaction products in the comparative example.
Figure 14B:
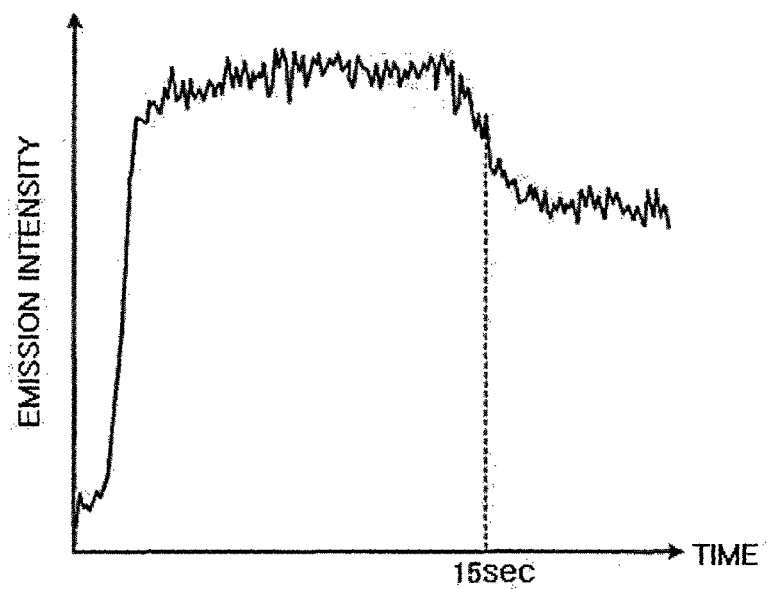
FIG. 14B is a view showing one example of temporal change of the emission intensity of reaction products in the embodiment.

FIG. 14A is a view showing one example of temporal change of the emission intensity of reaction products in the comparative example. FIG. 14B is a view showing one example of temporal change of the emission intensity of reaction products in the embodiment. Temporal changes of the emission intensity of reaction products ejected when a polysilicon film is subjected to a plasma process under the following process conditions are shown in FIGS. 14A and 14B showing the comparative example and the embodiment, respectively.

(Process Conditions)
Process Pressure: 1.33 Pa (10 mTorr)
RF power: 200 W (at upper part) and 300 W (at lower part)
Process gas: HBr (360 sccm)

When the plasma process is performed as designed, the emission intensity of the reaction products is suddenly decreased after about 15 seconds from start of the plasma process and is detected as an end point by an end point detector. As opposed to this, in the comparative example, the emission intensity of reaction products was suddenly decreased after about 7.8 seconds, as shown in FIG. 14A. In the comparative example, since the timing at the decrease of the emission intensity is too early, the end point detector detects the decrease of the emission intensity after about 7.8 seconds as an EPD error. It is believed that this is because the amount of reaction products ejected from the semiconductor wafer W in the course of etching is decreased to rapidly lower the emission intensity of reaction products due to no electric conduction of the shutter 70 and the shield member 60.

On the other hand, in this embodiment, for example, as shown in FIG. 14B, the emission intensity was suddenly decreased after about 15 seconds as designed. Accordingly, in this embodiment, no EPD error was detected. It is believed that this is because the amount of reaction products ejected from the semiconductor wafer W in the course of etching of the polysilicon film is maintained constant in the process chamber 12 to maintain the emission intensity of reaction products due to the electric conduction of the shutter 70 and the shield member 60, as described above.

One embodiment has been described in the above. With the plasma processing apparatus 1 of this embodiment, it is possible to prevent occurrence of an EPD error.

(Modification 1)

Figure 15:
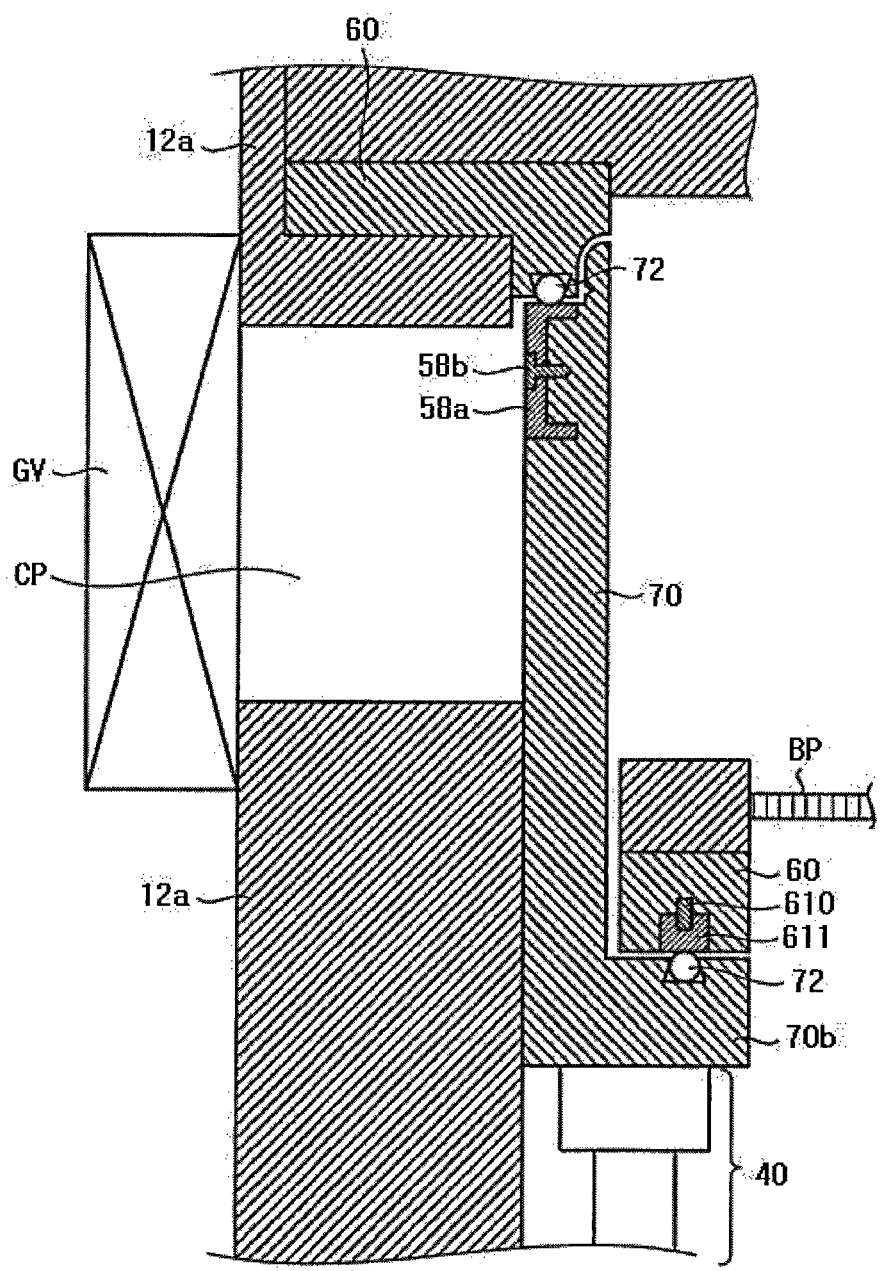
FIG. 15 is an enlarged sectional view showing one example of the configuration of the shutter in Modification 1 and its vicinity.
Figure 16:
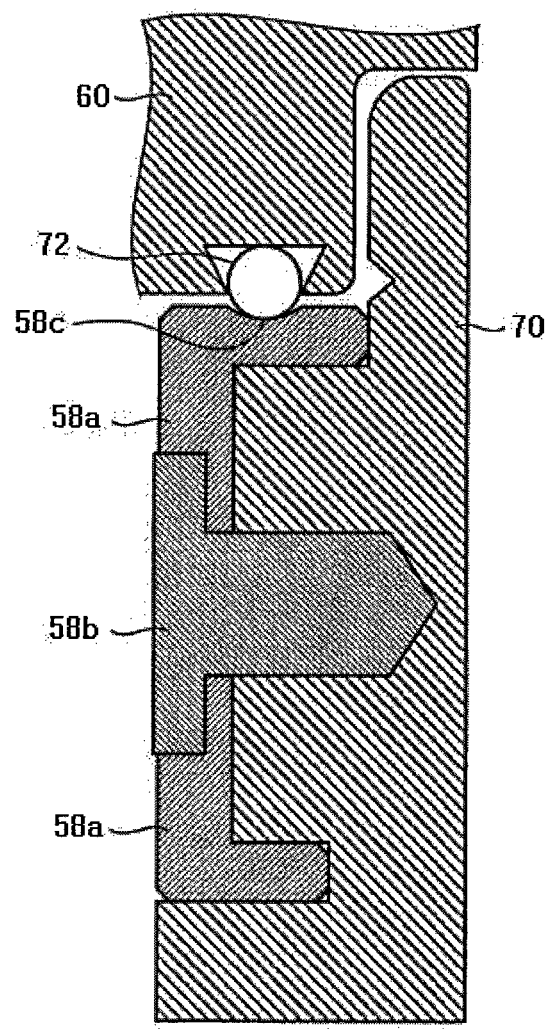
FIG. 16 is an enlarged sectional view showing one example of the configuration of the upper portion of the shutter in Modification 1 and its vicinity.
Figure 17:
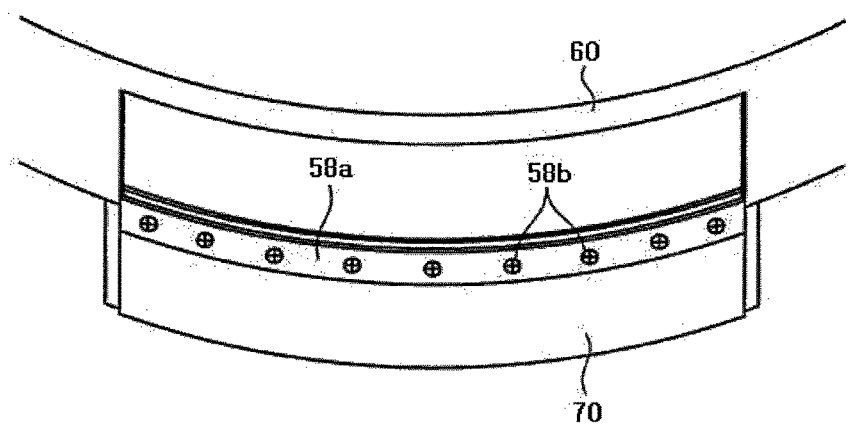
FIG. 17 is a view showing a state where the shutter is opened when viewed from the outside of the shield member.
Figure 18:
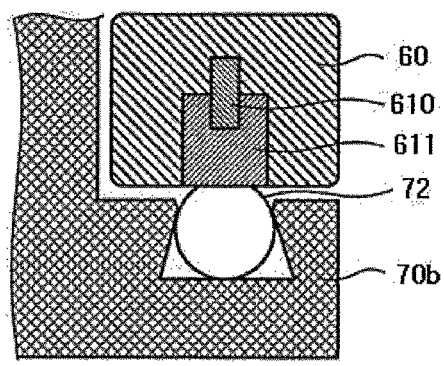
FIG. 18 is an enlarged view showing one example of the configuration of the lower portion of the shutter in Modification 1 and its vicinity.

Next, Modification 1 of the configuration of the shutter 70 and the shield member 60 will be described. FIG. 15 is an enlarged sectional view showing one example of the configuration of the shutter in Modification 1 and its vicinity. FIG. 16 is an enlarged sectional view showing one example of the configuration of the upper portion of the shutter in Modification 1 and its vicinity. FIG. 17 is a view showing a state where the shutter is opened when viewed from the outside of the shield member. FIG. 18 is an enlarged sectional view showing one example of the configuration of the lower portion of the shutter in Modification 1 and its vicinity. In FIGS. 15 to 18, the same elements as FIGS. 9 to 11 are denoted by the same reference numerals and redundant description thereof will be omitted.

In Modification 1, as illustrated in FIGS. 15 and 16, a contactor 72 formed of HASTELLOY® is disposed in a groove form ed on a surface of the shield member 60 which defines the top end of the opening OP. In addition, in Modification 1, as shown in the sectional views of FIGS. 15 and 16, a member 58a having a C-like section formed of HASTELLOY® is disposed at the upper portion of the shutter 70. The top surface of the C-like member 58a makes contact with the HASTELLOY® contactor 72. In addition, the member 58a provided at the upper portion of the shutter 70, the groove formed in the surface of the shield member 60 and the contactor 72 fitted in the groove may be collectively referred to as "contact mechanism". The member 58a is fastened to the shutter 79 by screws 58b. The HASTELLOY® member 58a is disposed to extend in the circumferential direction of the shutter 70 along the top surface of the shutter, as shown in FIG. 17.

Under the state where the shutter 70 closes the opening OP of the shield member 60, the HASTELLOY® member 58a contacts the contactor 72 disposed in the groove of the surface of the shield member 60. In addition, a concave portion conforming to the external shape of the contactor 72 may be provided in a surface 58c of the member 58a contacting the contactor 72 of the shield member 60 under the state where the shutter 70 closes the opening OP of the shield member 60. Thus, the member 58a can contact the contactor 72 over a wider area to provide less contact resistance under the state where the shutter 70 closes the opening OP of the shield member 60.

In addition, for example, as shown in FIG. 18, under the state where the shutter 70 closes the opening OP of the shield member 60, a member 611 formed of HASTELLOY® is mounted on a surface of the shield member 60 in contact with the contactor 72 disposed in a groove formed on the top surface of the second portion 70b of the shutter 70. The groove formed on the top surface of the second portion 70b of the shutter 70, the contactor 72 fitted in the groove and the member 611 mounted on the bottom of the shield member 60 may be collectively referred to as "contact mechanism". The member 611 is mounted on the shield member 60 by press-fitting one end of a pin 610 made of aluminum into the shield member 60 and press-fitting the other end into the member 611. In addition, a concave portion conforming to the external shape of the contactor 72 may be provided in a surface of the member 611 contacting the contactor 72 disposed at the second portion 70b of the shutter 70.

Like Modification 1, by mounting the HASTELLOY® member 58a on the shutter 70 by screws 58b and press-fitting the HASTELLOY® member 611 onto the pin 610 press-fitted in the shield member 60, a work burden of providing a HASTELLOY® layer for the shutter 70 or the shield member 60 can be alleviated as compared to a case where HASTELLOY® is sprayed onto the surface of the shutter or the shield member 60. In addition, since the mechanical strength of the HASTELLOY® layer can be increased, it is possible to prevent particle contamination in the process chamber 12 due to peeling-off of the HASTELLOY® layer.

(Modification 2)

Figure 19:
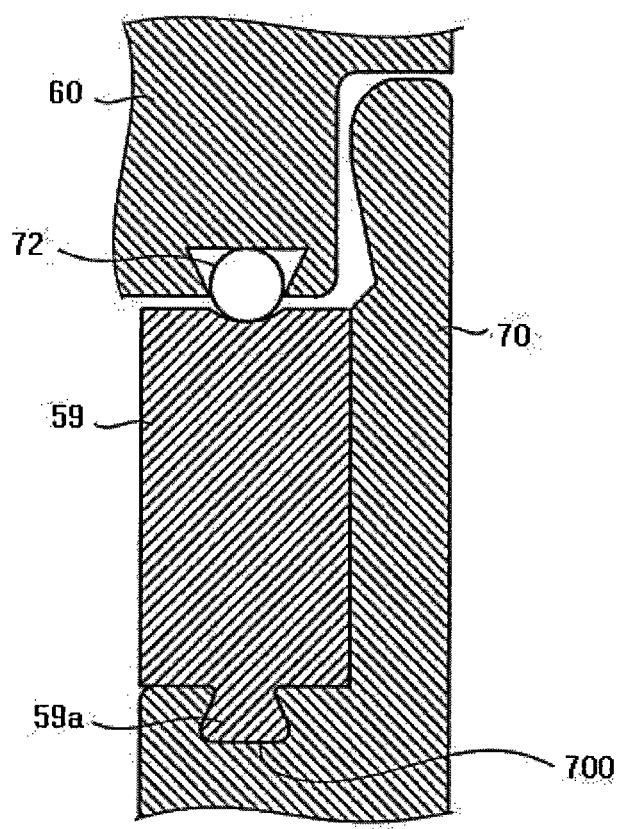
FIG. 19 is an enlarged view showing one example of the configuration of the upper portion of the shutter in Modification 2 and its vicinity.

Next, Modification 2 of the configuration of the shutter 70 and the shield member 60 will be described. FIG. 19 is an enlarged view showing one example of the configuration of the upper portion of the shutter in Modification 2. In the following Modifications 2 to 7, in figures showing these Modifications 2 to 7, the same elements as FIGS. 15 to 18 are denoted by the same reference numerals and redundant description thereof will be omitted. In addition, in the following Modifications 2 to 7, a portion of the shield member 60 contacting the contactor 72 provided at the lower second portion 70b of the shutter 70 has the same configuration as those in the above embodiments and Modification 1.

In Modification 2, for example, as shown in the sectional view of FIG. 19, a member 59 formed of HASTELLOY® is disposed at the upper portion of the shutter 70 to extend in the circumferential direction of the shutter 70 along the top surface of the shutter 70. For example, as shown in the sectional view of FIG. 19, a dovetail groove 700 is formed in the top surface of the shutter 70 to extend along the circumferential direction of the shutter 70. The dovetail groove 700 is gradually widened in depth. A ridge 59a formed to have the same sectional shape as the dovetail groove 700 is provided at the bottom of the HASTELLOY® member 59.

The member 59 is mounted on the shutter 70 by inserting the ridge 59a in the dovetail groove 700 of the shutter 70 from the left end or right end of the shutter 70 and moving the member 59 along the dovetail groove 700 of the shutter 70. The member 59 is fastened to the shutter 70, e.g., by screws from a surface making no contact with the shutter 70. A concave portion conforming to the external shape of the contactor 72 may be provided in a surface of the member 59 contacting the contactor 72 disposed in the groove formed in the surface of the shield member 60. The member 59 provided at the upper portion of the shutter 70, the groove formed in the surface of the shield member 60 and the contactor 72 fitted in the groove may be collectively referred to as "contact mechanism".

In Modification 2, since the HASTELLOY® member 59 provided at the shutter 70 makes contact with the HASTELLOY® contactor 59 provided at the shield member 60 under the state where the shutter 70 closes the opening OP of the shield member 60, the electric conduction of the shutter 70 and the shield member 60 is maintained to prevent occurrence of an EPD error.

(Modification 3)

Figure 20:
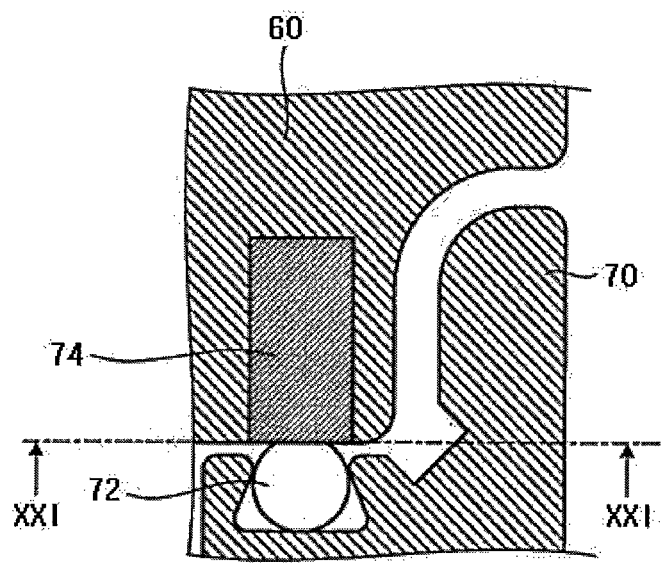
FIG. 20 is an enlarged view showing one example of the configuration of the upper portion of the shutter in Modification 3 and its vicinity.
Figure 21:
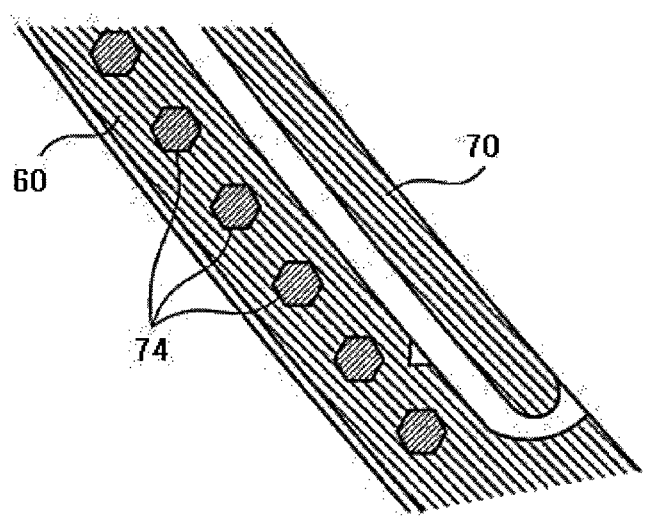
FIG. 21 is a sectional view taken along the line XXI-XXI in FIG. 20.

Next, Modification 3 of the configuration of the shutter 70 and the shield member 60 will be described. FIG. 20 is an enlarged view showing one example of the configuration of the upper portion of the shutter in Modification 3 and its vicinity. FIG. 21 is a sectional view taken along the line XXI-XXI in FIG. 20.

In Modification 3, for example, as shown in FIG. 20, the contactor 72 formed of HASTELLOY® is disposed in a groove formed in the top surface of the shutter 70. In addition, for example, as shown in FIG. 21, pins 74 formed of HASTELLOY® are press-fitted at predetermined intervals in a surface of the shield member 60 in contact with the contactor 72 of the shutter 70. Under the state where the shutter 70 closes the opening OP of the shield member 60, the contactor 72 of the shutter 70 contacts the HASTELLOY® pins 74 press-fitted in the shield member 60.

In addition, the surface of the shield member 60 contacting the contactor 72 of the shutter 70 under the state where the shutter 70 closes the opening OP of the shield member 60 may be subjected to alumite treatment or may be coated with yttr is ($Y_2O_3$). In addition, under the state where the HASTELLOY® pins 74 are press-fitted in the shield member 60 to slightly project from the surface of the shield member 60 and the shutter 70 closes the opening OP of the shield member 60, the contactor 72 of the shutter 70 may make contact with the HASTELLOY® pins 74 without making no contact with the surface of the shield member 60. Surfaces of the pins 74 contacting the contactor 72 of the shutter 70 may be concave along the external shape of the contactor 72. In addition, the groove formed in the top surface of the shutter 70, the contactor 72 fitted in the groove and the pins 74 press-fitted in the surface of the shield member 60 may be collectively referred to as "contact mechanism".

In Modification 3, since the HASTELLOY® contactor 72 provided at the shutter 70 makes contact with the HASTELLOY® pins 74 provided at the shield member 60 under the state where the shutter 70 closes the opening OP of the shield member 60, the electric conduction of the shutter 70 and the shield member 60 in the plasma process is maintained to prevent occurrence of an EPD error.

(Modification 4)

Figure 22:
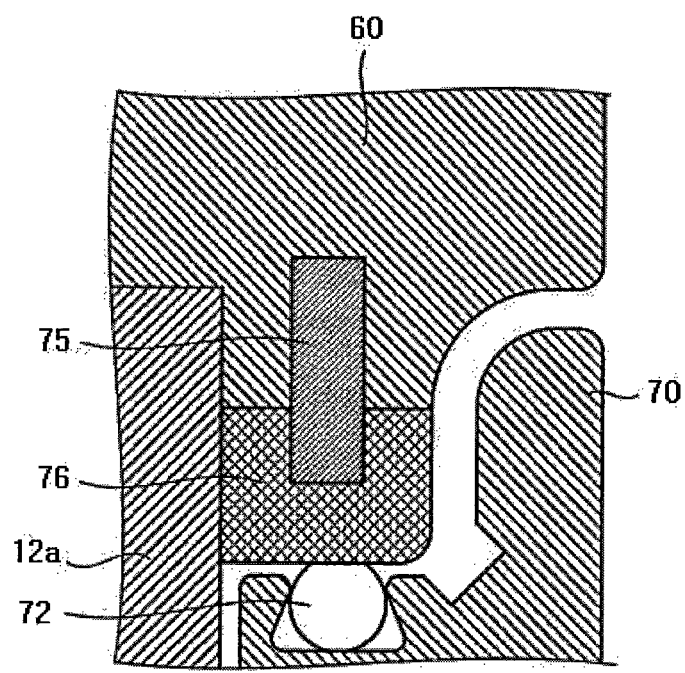
FIG. 22 is an enlarged view showing one example of the configuration of the upper portion of the shutter in Modification 4 and its vicinity.

Next, Modification 4 of the configuration of the shutter 70 and the shield member 60 will be described. FIG. 22 is an enlarged view showing one example of the configuration of the upper portion of the shutter in Modification 4 and its vicinity.

In Modification 4, for example, as shown in FIG. 22, the contactor 72 formed of HASTELLOY® is disposed in a groove formed in the top surface of the shutter 70. In addition, for example, as shown in FIG. 22, a member 76 formed of HASTELLOY® is mounted on a surface of the shield member 60 in contact with the contactor 72 of the shutter 70 to extend along the surface of the shield member 60 which defines the top end of the opening OP and opposes the shutter 70. The member 76 is mounted on the shield member 60 by press-fitting one end of a pin 75 made of aluminum into the shield member 60 and press-fitting the other end into the member 76. In addition, a concave portion conforming to the external shape of the contactor 72 may be provided in a surface of the member 76 contacting the contactor 72 of the shutter 70. The groove formed in the top surface of the shutter 70, the contactor 72 fitted in the groove and the member 76 mounted on the surface of the shield member 60 may be collectively referred to as "contact mechanism".

In Modification 4, since the HASTELLOY® contactor 72 provided at the shutter 70 makes contact with the HASTELLOY® member 76 provided at the shield member 60 under the state where the shutter 70 closes the opening OP of the shield member 60, the electric conduction of the shutter 70 and the shield member 60 in the plasma process is maintained to prevent occurrence of an EPD error.

(Modification 5)

Figure 23:
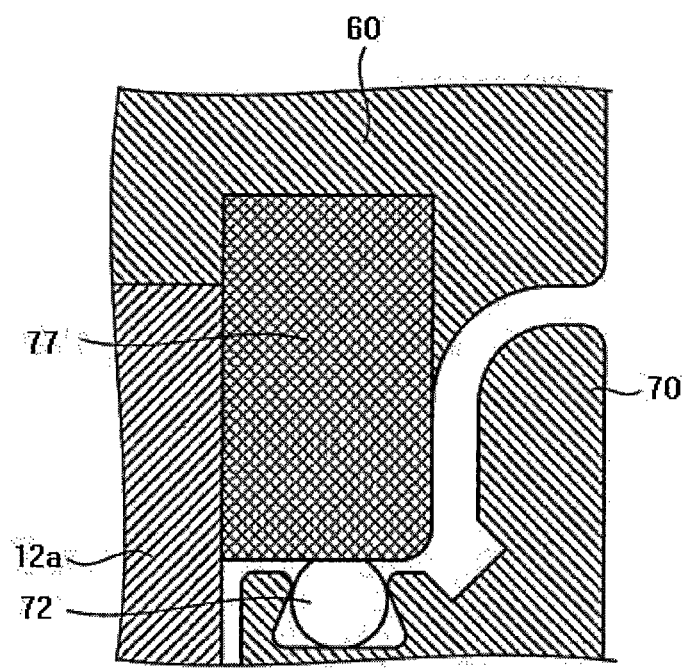
FIG. 23 is an enlarged view showing one example of the configuration of the upper portion of the shutter in Modification 5 and its vicinity.

Next, Modification 5 of the configuration of the shutter 70 and the shield member 60 will be described. FIG. 23 is an enlarged view showing one example of the configuration of the upper portion of the shutter in Modification 5 and its vicinity.

In Modification 5, for example, as shown in FIG. 23, the contactor 72 formed of HASTELLOY® is disposed in a grove formed in the top surface of the shutter 70. In addition, for example, as shown in FIG. 23, a member 77 formed of HASTELLOY® is mounted on a surface of the shield member 60 in contact with the contactor 72 of the shutter 70 to extend along the surface of the shield member 60 which defines the top end of the opening OP and opposes the shutter 70. The member 77 is mounted on the shield member 60 by press-fitting the member 77 into the shield member 60. In addition, a concave portion conforming to the external shape of the contactor 72 may be provided in a surface of the member 77 contacting the contactor 72 of the shutter 70. The groove formed in the top surface of the shutter 70, the contactor 72 fitted in the groove and the member 77 press-fitted in the surface of the shield member 60 may be collectively referred to as "contact mechanism".

In Modification 5, since the HASTELLOY® contactor 72 provided at the shutter 70 makes contact with the HASTELLOY® member 77 provided at the shield member 60 under the state where the shutter 70 closes the opening OP of the shield member 60, the electric conduction of the shutter 70 and the shield member 60 in the plasma process is maintained to prevent occurrence of an EPD error.

(Modification 6)

Figure 24:
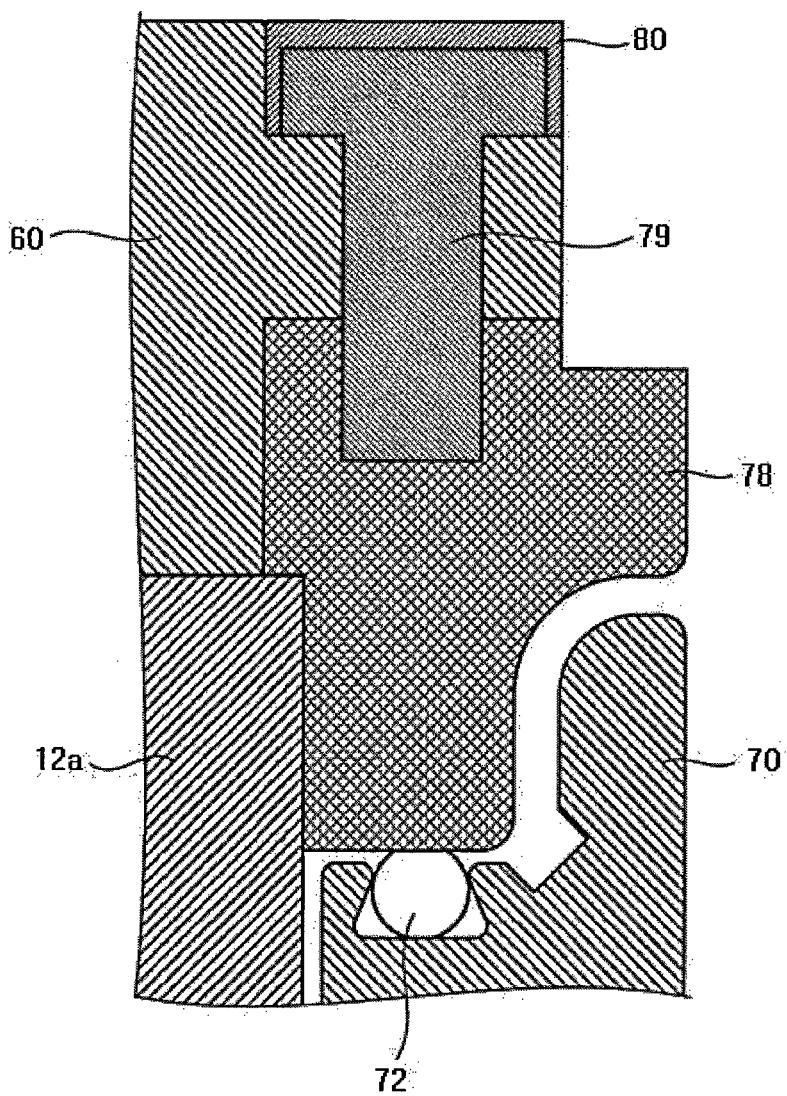
FIG. 24 is an enlarged view showing one example of the configuration of the upper portion of the shutter in Modification 6 and its vicinity.

Next, Modification 6 of the configuration of the shutter 70 and the shield member 60 will be described. FIG. 24 is an enlarged view showing one example of the configuration of the upper portion of the shutter in Modification 6 and its vicinity.

In Modification 6, for example, as shown in FIG. 24, the contactor 72 formed of HASTELLOY® is disposed in a groove formed in the top surface of the shutter 70. In addition, for example, as shown in FIG. 24, a member 78 formed of HASTELLOY® is mounted on a surface of the shield member 60 in contact with the contactor 72 of the shutter 70 to extend along the surface of the shield member 60 which defines the top end of the opening OP and opposes the shutter 70. The member 78 is fastened to the shield member 60 by screws 79 screwed into them from above with the shield member 60 interposed therebetween. Heads of the screws 79 are covered with caps 80. In addition, a concave portion conforming to the external shape of the contactor 72 may be provided in a surface of the member 78 contacting the contactor 72 of the shutter 70. The groove formed in the top surface of the shutter 70, the contactor 72 fitted in the groove and the member 78 mounted on the surface of the shield member 60 may be collectively referred to as "contact mechanism".

In Modification 6, since the HASTELLOY® contactor 72 provided at the shutter 70 makes contact with the HASTEL- LOY® member 78 provided at the shield member 60 under the state where the shutter 70 closes the opening OP of the shield member 60, the electric conduction of the shutter 70 and the shield member 60 in the plasma process is maintained to prevent occurrence of an EPD error.

(Modification 7)

Figure 25:
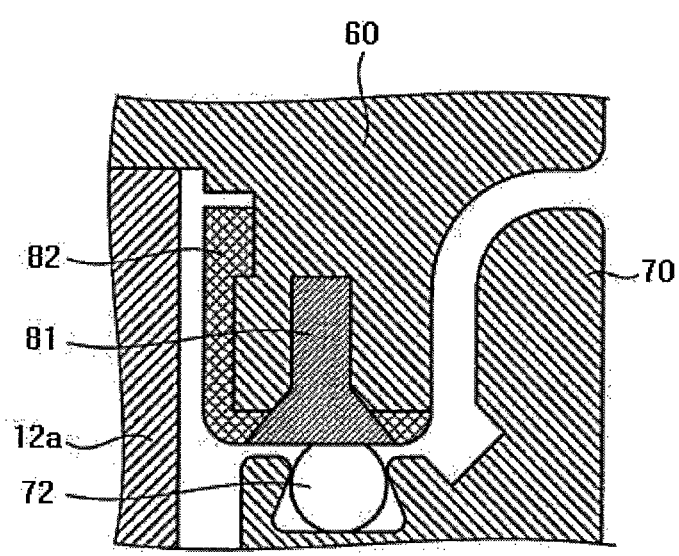
FIG. 25 is an enlarged view showing one example of the configuration of the upper portion of the shutter in Modification 7 and its vicinity.

Next, Modification 7 of the configuration of the shutter 70 and the shield member 60 will be described. FIG. 25 is an enlarged view showing one example of the configuration of the upper portion of the shutter in Modification 7 and its vicinity.

In Modification 7, for example, as shown in FIG. 25, the contactor 72 formed of HASTELLOY® is disposed in a groove formed in the top surface of the shutter 70. In addition, for example, as shown in FIG. 25, a member 82 formed of HASTELLOY® and having an L-like section is mounted on a surface of the shield member 60 in contact with the contactor 72 of the shutter 70 to extend along the surface of the shield member 60 which defines the top end of the opening OP and opposes the shutter 70. The member 82 is fastened to the shield member 60 by screws 81 screwed into them from below. In addition, a concave portion conforming to the external shape of the contactor 72 may be provided in a surface of the member 82 contacting the contactor 72 of the shutter 70. In addition, under the state where the HASTELLOY® member 82 is fastened to the shield member 60 by the screws 81, the heads of the screws 81 may be buried in the bottom surface of the HASTELLOY® member 82. The groove formed in the top of the shutter 70, the contactor 72 fitted in the groove and the member 82 mounted on the surface of the shield member 60 may be collectively referred to as "contact mechanism".

In Modification 7, since the HASTELLOY® contactor 72 provided at the shutter 70 makes contact with the HASTELLOY® member 82 provided at the shield member 60 under the state where the shutter 70 closes the opening OP of the shield member 60, the electric conduction of the shutter 70 and the shield member 60 in the plasma process is maintained to prevent occurrence of an EPD error.

While the invention has been shown and described with respect to the embodiments, it will be understood by those skilled in the art that various changes and modification may be made without departing from the scope of the invention as defined in the following claims. It is apparent from the claims that such changes and modifications are included in the scope of the invention.

What is claimed is:

1. A plasma processing apparatus for performing a plasma process for a target object, comprising:
a process chamber including a sidewall having a transfer port for loading and unloading the target object;
a mounting table disposed in the process chamber;
a shield member disposed along an inner surface of the sidewall to surround the mounting table, the shield member including an opening which faces the transfer port and a bottom portion which defines a bottom of the opening; and
a shutter which is movable up and down between an open position and a closed position, wherein in the closed position the shutter closes the opening, and wherein:
the shutter includes:
(i) a first portion which faces the opening and closes the opening in the closed position, and
(ii) a second portion which faces a lower side of the bottom portion of the shield member, wherein the shutter includes a contactor having a nickel-based alloy surface, and the contactor is located at the second portion of the shutter,
the shield member further includes a nickel-based alloy contact surface which faces the second portion of the shutter,
the nickel-based alloy contact surface of the shield member and the nickel-based alloy surface of the contactor of the shutter contact each other when the shutter is in the closed position,
the first portion of the shutter includes a surface which is formed of a material which is different from the nickel-based alloy surface of the contactor,
wherein the shield member includes an aluminum portion and a nickel-based alloy portion provided below the aluminum portion at the lower side of the bottom portion of the shield member,
wherein the nickel-based alloy portion provides the nickel alloy contact surface of the shield member,
wherein the shutter includes a first groove on the second portion,
wherein the contactor is an elastic member fitted in the first groove and having a nickel-based alloy surface to provide the nickel-based alloy surface of the contactor of the shutter, and
wherein the aluminum portion includes a second groove and the nickel-based alloy portion comprises a block of nickel-based alloy material fitted into the second groove.

2. The plasma processing apparatus of claim 1, wherein the nickel-based alloy elastic member is a spiral-shaped member.

3. The plasma processing apparatus of claim 1, wherein the apparatus further includes a C-shaped member which is fastened to the upper portion of the first portion of the shutter by a screw, wherein the C-shaped member is formed of nickel-based alloy.

4. The plasma processing apparatus of claim 1, wherein the shutter includes a thin portion and a thick portion, wherein the thin portion projects upward and circumferentially from a radial outer region of the thick portion.

5. The plasma processing apparatus of claim 1, wherein the nickel-based alloy material restrains particles from being generated from the nickel-based alloy contact surface of the shield member and the nickel-based alloy surface of the contactor of the shutter by opening and closing of the shutter.

6. The plasma processing apparatus of claim 1, wherein the contactor having the nickel-based alloy surface of the shutter is removably coupled to the first portion of the shutter, and wherein the first portion is formed of aluminum.

* * * * *